United States Patent
Hanada et al.

(10) Patent No.: US 7,005,310 B2
(45) Date of Patent: Feb. 28, 2006

(54) MANUFACTURING METHOD OF SOLID-STATE IMAGE SENSING DEVICE

(75) Inventors: Kenji Hanada, Kodaira (JP); Masaki Nakanishi, Tokyo (JP); Tomoo Matsuzawa, Tokyo (JP); Koji Shida, Takasaki (JP); Kazutoshi Takashima, Miyota (JP)

(73) Assignees: Renesas Technology Corporation, Tokyo (JP); Renesas Eastern Japan Semiconductor, Inc., Tokyo (JP)

( * ) Notice: Subject to any disclaimer, the term of this patent is extended or adjusted under 35 U.S.C. 154(b) by 0 days.

(21) Appl. No.: 10/651,087

(22) Filed: Aug. 29, 2003

(65) Prior Publication Data

US 2004/0166763 A1    Aug. 26, 2004

(30) Foreign Application Priority Data

Aug. 14, 2002 (JP) .............................. 2002-236620
Aug. 25, 2003 (JP) .............................. 2003-300358

(51) Int. Cl.
*H01L 21/00* (2006.01)
*H04N 5/225* (2006.01)

(52) U.S. Cl. .......................... 438/25; 438/29; 348/340

(58) Field of Classification Search .................. 257/59, 257/98, 414, 911; 348/340, 373, 376; 396/6; 438/25, 26, 27, 29
See application file for complete search history.

(56) References Cited

U.S. PATENT DOCUMENTS

| | | | | |
|---|---|---|---|---|
| 3,599,055 A | * | 8/1971 | Bloom | 257/225 |
| 4,485,706 A | * | 12/1984 | Disharoon | 83/42 |
| 6,033,289 A | * | 3/2000 | Cellier et al. | 451/28 |
| 6,345,903 B1 | * | 2/2002 | Koike et al. | 362/249 |
| 6,476,417 B1 | * | 11/2002 | Honda et al. | 257/59 |
| 2003/0098912 A1 | * | 5/2003 | Hosokai et al. | 348/207.99 |

FOREIGN PATENT DOCUMENTS

| | | |
|---|---|---|
| JP | 2001-245217 | 3/2000 |
| JP | 3084092 | 5/2001 |
| JP | 2003-32557 | 7/2001 |
| JP | 2003-78077 | 9/2001 |
| JP | 2003-78122 | 9/2001 |

* cited by examiner

*Primary Examiner*—Pamela E. Perkins
(74) *Attorney, Agent, or Firm*—Reed Smith LLP; Stanley P. Fisher, Esq.; Juan Carlos A. Marquez, Esq.

(57) ABSTRACT

A sensor chip and a lens mount accommodating therein the sensor chip are mounted on a surface of a wiring substrate and a lens holder accommodating a lens therein is coupled with the lens mount. On a rear surface of the wiring substrate, a logic chip, a memory chip and a passive component are mounted and they are sealed with a seal resin. An electrode pad of the sensor chip is electrically connected to an electrode on the surface of the wiring substrate via a bonding wire but a stud bump is also formed on the electrode at the surface of the wiring substrate and this stud bump is connected with the bonding wire. On the surface of the wiring substrate, a flexible substrate is bonded with an anisotropic conductive film and a bonding material. When a camera module is to be manufactured, the surface side of the wiring substrate is assembled after the rear surface side of the wiring substrate is assembled.

6 Claims, 17 Drawing Sheets

MANUFACTURING METHOD OF SOLID-STATE IMAGE SENSING DEVICE

TECHNICAL FIELD OF THE INVENTION

The present invention relates to a manufacturing method of solid-state image sensing device and particularly to a solid-state image sensing device to be used for a mobile communication device such as a mobile telephone and the technology which can be applied effectively to the same manufacturing method.

BACKGROUND OF THE INVENTION

A solid-state image sensing device is a photo-electric converting device for converting an optical signal from an image to an electrical signal by utilizing arrangement of pixels. On the main surface of a substrate of the solid-state image sensing device, image sensing elements are mounted in the condition with the light sensing surfaces upward. In the upper direction of these image sensing elements, a filter and a lens are installed sequentially from the lower side under the condition being supported with a frame body.

The Japanese Published Unexamined Patent Application No. 2000-78122 describes the technology that CCDs are mounted on the rear surface of a first semiconductor module comprising a DSP or the like to process electrical signals of CCDs, a second semiconductor module including a cavity in the part corresponding to the CCDs is mounted to the rear surface of the first semiconductor module, and a lens is provided at the upper part of the cavity.

Moreover, the Japanese Published Unexamined Patent Application No. 2003-78077 describes the technology that CCDs are mount on the rear surface of a first semiconductor module comprising a DSP or the like to process electrical signals of CCDs, a mount including a lens at the upper part thereof is mounted covering the CCDs, and a second semiconductor module and rear surface chip components are mounted on the rear surface of the first semiconductor module.

In addition, the Japanese Published Unexamined Patent Application No. 2003-32557 describes the technology that after electronic components and DSP are mounted on the rear surface of a circuit substrate, molding shield is performed and a flat molding shield is formed and thereafter solid-state imaging elements are mounted on the front surface of the circuit substrate and these solid-state image sensing elements and bonding pads are connected with the wire-bonding method.

SUMMARY OF THE INVENTION

The inventors of the present invention have proved the following results by investigation.

A solid-state image sensing device uses optical components such as filter and lens. If foreign matters are deposited to these components, a failure may occur in the image displayed through the solid-stage image sensing device. Therefore, the solid-state image sensing device is very sensible for entry of foreign matters and its manufacturing yield may be lowered easily.

Moreover, in recent years, requirement for reduction in sizes including thickness is more and more increasing for the solid-state image sensing device. However, when sizes are reduced, electronic components mounting area is also reduced and thereby a demerit such as connection failure of bonding wire are likely to be caused. This demerit will reduce the manufacturing yield of the sold-state image sensing device.

Therefore, it is an object of the present invention to provide a solid-state image sensing device which can improve the manufacturing yield thereof and a method of manufacturing the same solid-state image sensing device.

The aforementioned and the other objects and novel features of the present invention will become apparent from the description of the present specification and the accompanying drawings thereof.

The typical inventions of the present invention disclosed in the present specification will be summarized as follows.

The solid-state image sensing device of the present invention is formed by joining a flexible substrate to a wiring substrate to mount image sensing elements using an anisotropic conductive film and a bonding material.

Moreover, the solid-state image sensing device of the present invention is also formed by connecting bonding wires for electrically connecting the electrodes of the main surface of the wiring substrate mounting image sensing elements to the bumps formed on the electrodes on the main surface of the wiring substrate.

In addition, the solid-state image sensing device of the present invention is formed by allocating a filter provided between image sensing elements and a lens to the position nearer to the lens than the image sensing elements.

Moreover, the solid-state image sensing device of the present invention is formed by assembling first the system components mounting surface of the wiring substrate and then assembling the optical components mounting surface of the opposite surface.

In the method of manufacturing a solid-state image sensing device of the present invention, after electronic components are mounted on the main surface in the opposite side of the surface to mount image sensing elements of the wiring substrate, a sealing resin portion is formed and then a groove is formed to the sealing resin portion.

Further, in the method of manufacturing a solid-state image sensing device of the present invention, a wiring substrate mounting image sensing elements is cut with dry-dicing.

Moreover, in the method of manufacturing a solid-state image sensing device of the present invention, a bonding material is selectively coated to the joining surface of a frame body via a mask and this frame body is then joined on the wiring substrate covering the image sensing elements mounted on the wiring substrate.

The effects of the typical inventions of the present invention disclosed in the present specification are briefly described as follows.

The manufacturing yield of a solid-state image sensing device can be improved by joining a flexible substrate to a wiring substrate mounting image sensing elements with an anisotropic conductive film and a bonding material.

Moreover, the manufacturing yield of a solid-state image sensing device can be improved by connecting bonding wires for electrically connecting the electrodes of the main surface of the wiring substrate mounting image sensing elements and the electrodes of the image sensing elements to the bumps formed on the electrodes of the main surface of the wiring substrate.

In addition, the manufacturing yield of a solid-state image sensing device can be improved by allocating a filter provided between image sensing elements and a lens to the position nearer to the lens than the image sensing elements.

Further, the manufacturing yield of a solid-state image sensing device can be improved by assembling the system components mounting surface of the wiring substrate and then assembling the optical components mounting surface of the surface in the opposite side.

Moreover, the manufacturing yield of a solid-state image sensing device can be improved by forming a sealing resin portion after mounting electronic components to the main surface of the opposite side of the surface to mount image sensing elements of the wiring substrate and then forming a groove to the sealing resin portion.

Moreover, the manufacturing yield of a solid-state image sensing device can be improved by cutting the wiring substrate mounting image sensing elements with dry-dicing.

Moreover, the manufacturing yield of a solid-state image sensing device can be improved by selectively coating the joining surface of frame body with a bonding material via a mask and then joining this frame body to the wiring substrate covering the image sensing elements mounted on the wiring substrate.

DESCRIPTION OF THE PREFERRED EMBODIMENTS

The preferred embodiment of the present invention will be described in detail with reference to the accompanying drawings. The identical components having the identical functions are indicated by the identical numerals throughout the drawings and the redundant description is avoided. In the following description, the same or similar portions are never described repeatedly, unless otherwise required particularly.

Moreover, the drawings used for describing the preferred embodiments may include the hatched areas, even if these are plan views, in order to realize easier reading thereof.

A solid-state image sensing device and a method of manufacturing the same of the present invention will be described with reference to the accompanying drawings. The solid-state image sensing device of the present invention relates to a camera module which is used as an image input portion, for example, of a mobile telephone, a TV phone, a PC camera, a PDA (Personal Digital Assistants: Mobile information terminal), an optical mouse, a door phone, a monitoring camera, a finger print recognition device, and a toy or the like.

In this embodiment, there is described an example that the present invention is applied to a $1.1 \times 10^5$ pixels CMOS (Complementary Metal Oxide Semiconductor) sensor type camera module corresponding to CIF (Common Immediate Format).

Figure 1:
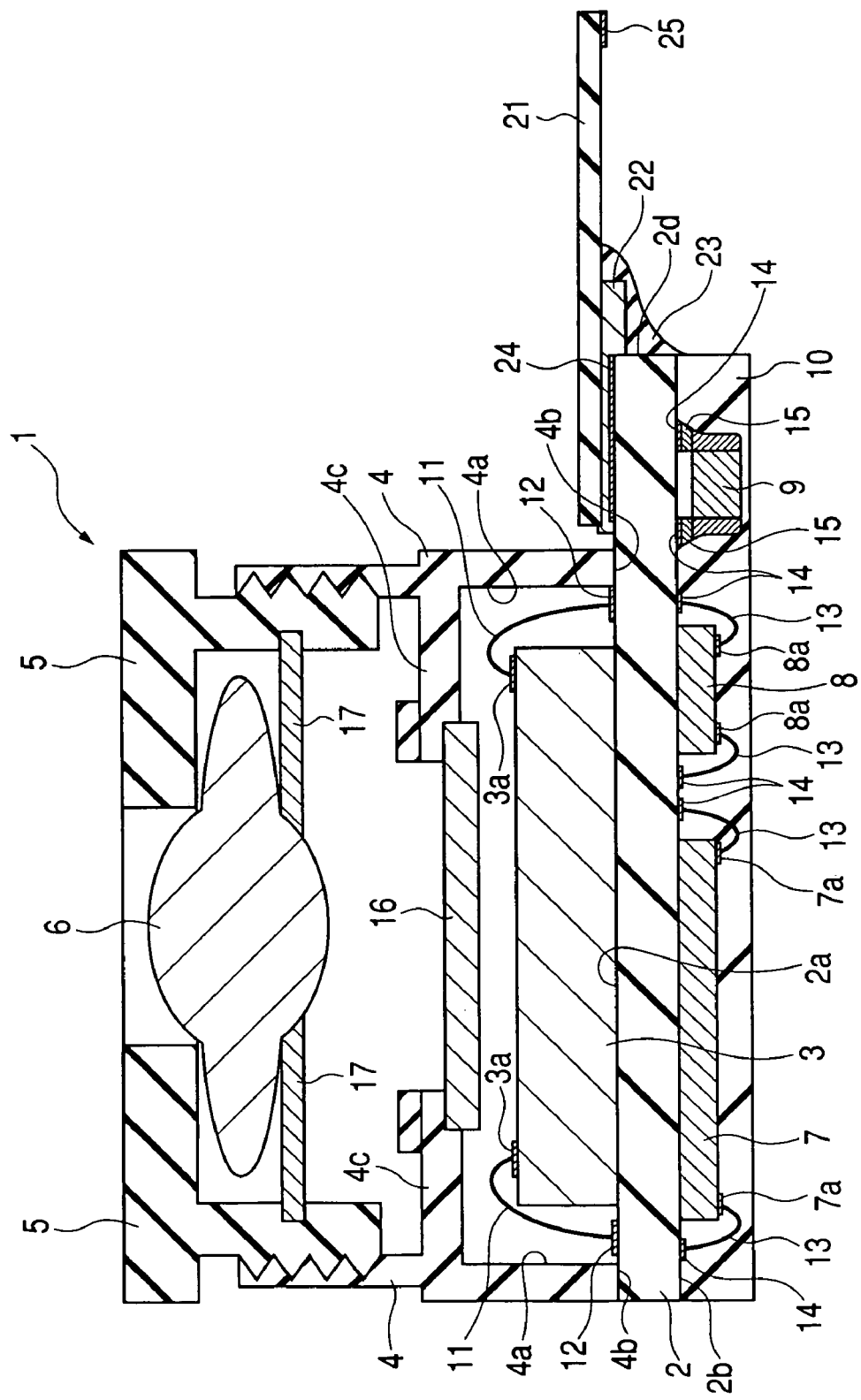
FIG. 1 is a cross-sectional view illustrating a structure of a camera module as an embodiment of the present invention.

FIG. 1 is a cross-sectional view illustrating a structure of a solid-state image sensing device as an embodiment of the present invention, for example, a camera module (solid-state image sensing device) 1.

As illustrated in FIG. 1, the camera module 1 of the present embodiment comprises a wiring substrate (circuit substrate, mounting substrate, multilayer wiring substrate) 2, a sensor chip (image sending element, solid-state image sensing element, semiconductor image sensing element) as a semiconductor chip for optical sensor mounted on a surface of the wiring substrate (optical component mounting surface) 2a, a lens mount (frame body) 4 joined (bonded) to the wiring substrate 2 for accommodating the sensor chip 3 therein, a lens holder (lens holding portion, lens Assy) 5 coupled with the lens mount 4, a lens (optical lens) 6 held or accommodated within the lens holder 5, a logic chip 7 as a semiconductor chip for logic mounted on a rear surface 2b of the wiring substrate 2 (system components mounting surface), a memory chip 8 as the semiconductor chip for memory, a passive component (passive element) 9, and a sealing resin (sealing portion, sealing resin portion) 10 formed on the rear surface 2b of the wiring substrate 2 covering the logic chip 7, memory chip 8 and passive component 9.

The wiring substrate 2 has the multilayer wiring structure formed by laminating, for example, an insulation layer consisting of resin material layer (for example, glass epoxy system resin material layer) and a wiring layer (conductive layer). An electrode pad (bonding pad) 3a of the sensor chip 3 mounted on the surface 2a of the wiring substrate 2 is electrically connected to an electrode 12 formed on the surface 2a of the wiring substrate 2 via a bonding wire 11. An electrode pad (bonding pad) 7a of the logic chip 7 mounted on the rear surface 2b of the wiring substrate 2 which is the main surface in the opposite side of the surface 2a and an electrode pad (bonding pad) 8a of the memory chip 8 are electrically connected to an electrode 14 formed on the rear surface 2b of the wiring substrate 2 via a bonding wire 13. For example, the bonding wires 11, 13 are formed of gold (Au). The passive component 9 is electrically connected to an electrode 14 formed on the rear surface 2b of the wiring substrate 2 via a conductive joining material 15 such as solder. In this embodiment, as will be described later, a gold stud bump (not illustrated in FIG. 1) is formed on the electrode 12 of the surface 2a of the wiring substrate 2 and the bonding wire is connected with this stud bump.

As required, the sensor chip 3, logic chip 7, memory chip 8 and passive component 9 are electrically connected via bonding wires 11, 13, conductive layer (conductive patterns) formed on the surface 2a and rear surface 2b of the wiring substrate 2 or therein or conductors within the through holes (not illustrated) formed on the wiring substrate 2.

The sensor chip 3 is mounted on the surface 2a of the wiring substrate 2 in the condition with the surface (light sensing surface, light sensing element forming surface) where the CMOS image sensor circuit is formed facing upward. The CMOS image sensor circuit formed on the sensor chip 3 is formed with the CMOS process which is generally used in the semiconductor device manufacturing step. This CMOS image sensor circuit comprises a sensor array (light sensing element region) and an analog circuit for processing an electrical signal obtained from the sensor array. The light condensed by the lens 6 allocated in the upper side of the sensor chip 3 is incident to the sensor array at the surface of the sensor chip 3. In this sensor array, a plurality of light sensing elements are allocated regularly in the vertical and lateral directions along the main surface of the sensor chip 3. Each light sensing element is an area where pixel of the CMOS image sensor circuit is formed and has the photo-electric converting function to convert an incident light signal to an electrical signal. As this light sensing element, for example, a photodiode or phototransistor is used. At the external circumference of the main surface of the sensor chip 3, a plurality of electrode pads 3a is formed along this external circumference. This bonding pad 3a is a leadout electrode of the CMOS image sensor circuit of the sensor chip 3 and is electrically connected to the electrode 12 and wiring of the wiring substrate 2 through the bonding wire 11.

The logic chip 7, memory chip 8 and passive component 9 mounted on the rear surface of the wiring substrate 2 are mainly electronic components to form the system for controlling process of electrical signals obtained from the sensor chip 3 and operations of the CMOS image sensor circuit of the sensor chip 3. For example, the logic chip 7 includes an arithmetic circuit for processing digital signal such as DSP (Digital Signal Processor) having the function to perform high-speed process for the electrical signal transferred from the sensor chip 3. For example, a non-volatile memory circuit such as EEPROM (Electrically Erasable Programmable Read-Only Memory) is formed on the memory chip. The passive component 9 is a passive element such as a resistance element and a capacitance element. As the passive component, a chip component such as chip resistance and chip capacitance may be used.

The sealing resin 10 formed on the rear surface 2b of the wiring substrate 2 is formed, for example, of a thermosetting resin material and it may include a filler. The logic chip 7, memory chip 8, passive component 9 and bonding wire 13 are protected through the sealing by the sealing resin 10.

The lens mount 4 and lens holder 5 are composed of a resin material or plastic material (insulation material) such as PBT (PolyButhylene Terephthalate). The lens mount 4 is joined on the front surface 2a of the wiring substrate 2 covering the sensor chip 3 and a bonding surface 4b as the bottom surface in the leg portion side of the lens mount 4 is bonded (deposited) on the surface 2a of the wiring substrate 2 with the bonding material. In the head portion side of the lens mount 4, the lens holder 5 is mounted closing an aperture of the head portion of the lens mount 4. An external wall of lower portion of the lens holder 4 and an internal wall of the head portion of the lens mount 4 are threaded, the lens holder 5 is engaged with these threaded portion through rotation thereof, the lens holder 5 is coupled with the lens mount 4 by inserting a part of the lens holder 5 into the aperture of the head portion of the lens mount 4, and moreover the lens holder 5 is fixed with the bonding material coated at the external circumference of the coupling portion.

Within the lens mount 4, a partitioning plate 4c is provided to partitioning an upper chamber and a lower chamber and an IR filter (IR glass filter) 16 is allocated or held at an aperture of this partitioning plate 4c. The IR filter 16 may be given the function to pass a visible light, but not to pass unwanted infrared radiation higher than a predetermined wavelength. The IR filter 16 is allocated between the sensor chip 3 and the lens 6, and therefore the external light of the camera module 1 is condensed by the lens 6 and radiates the sensor chip 3 through the IR filter 16. The lens 6 is fixed or held within the lens holder 5 with a rear squeezing means (clamping member) 17, for example, consisting of a copper material.

A flexible substrate (flexible wiring substrate) 21 is bonded on the surface 2a of the wiring substrate 2 at the external side of the lens mount 4. The flexible substrate 21 is constituted by forming a wiring pattern (conductor pattern) on a highly flexible base film (which may be bent easily) (insulation film) consisting, for example, of polyimide and polyester material or the like. The flexible substrate 21 is joined (bonded) to the surface 2a of the wiring substrate 2 via an anisotropic conductive film (ACF) 22 and is also joined (bonded) to the wiring substrate 2 with a bonding material 23. The bonding material 23 is composed, for example, of an ultraviolet-setting type bonding material (UV bonding agent). This flexible substrate 21 is formed extending the anisotropic conductive film 22 to the main surface in the side adhered to the wiring substrate 2 thereof from the side wall (side surface) 2d of the wiring substrate 2. The wiring pattern (not illustrated) formed on the anisotropic conductive film 22 is electrically connected to a terminal portion (metal terminal portion, connecting terminal, connector) 24 of the surface 24 of the wiring substrate 2 via conductive particles within the anisotropic conductive film 22. As required, this terminal portion 24 is electrically connected to the electrode 12 of the surface 2a of the wiring substrate 2 and the electrode 14 of the rear surface 2b thereof via conductive layers (conductor patterns) at the surface 2a, rear surface 2b or within the wiring substrate 2 or the conductors in the through holes (not illustrated) formed on the wiring substrate 2. Namely, the terminal portion 24 is electrically connected to the circuit within the camera module 1 through the wiring of the wiring substrate 2 and works as an external terminal of the wiring substrate 2. Therefore, a connector 25 formed at the end portion of the flexible substrate 21 is electrically connected to the terminal portion 24 of the wiring substrate 2 via the wiring pattern (not illustrated) of the flexible substrate 21 and works as an external terminal (external connecting terminal) of the camera module 1.

Figure 2:
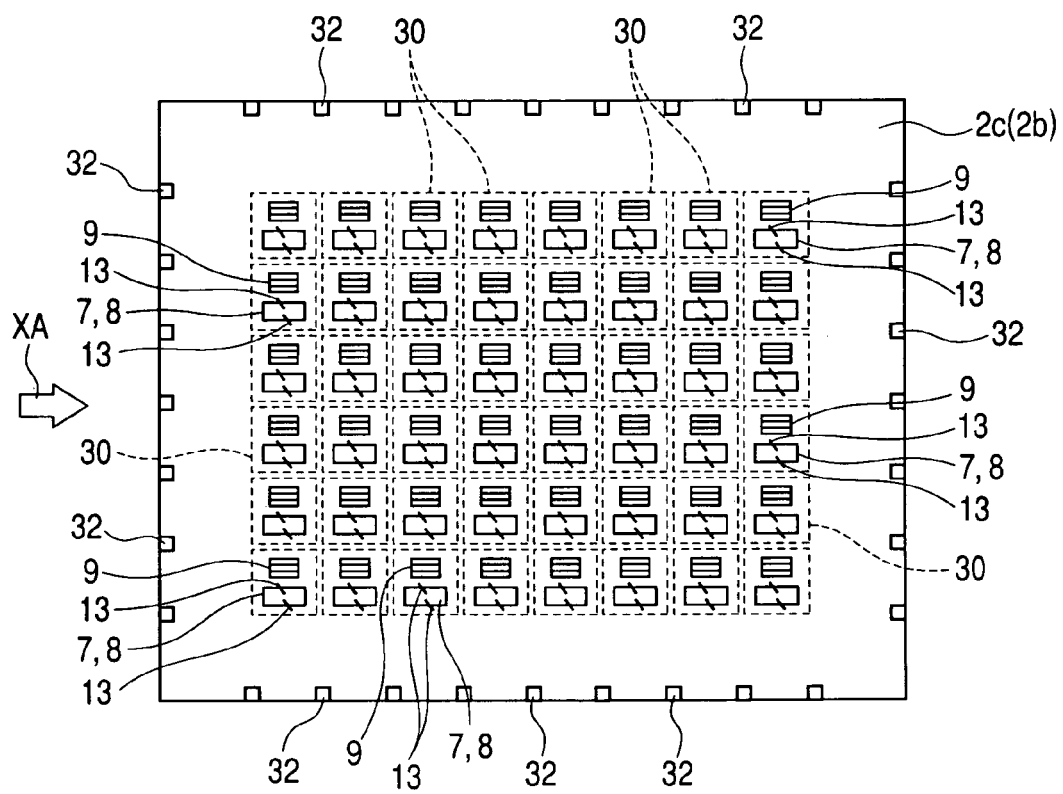
FIG. 2 is a total plan view of the camera module under the manufacturing step as the embodiment of the present invention.
Figure 3:
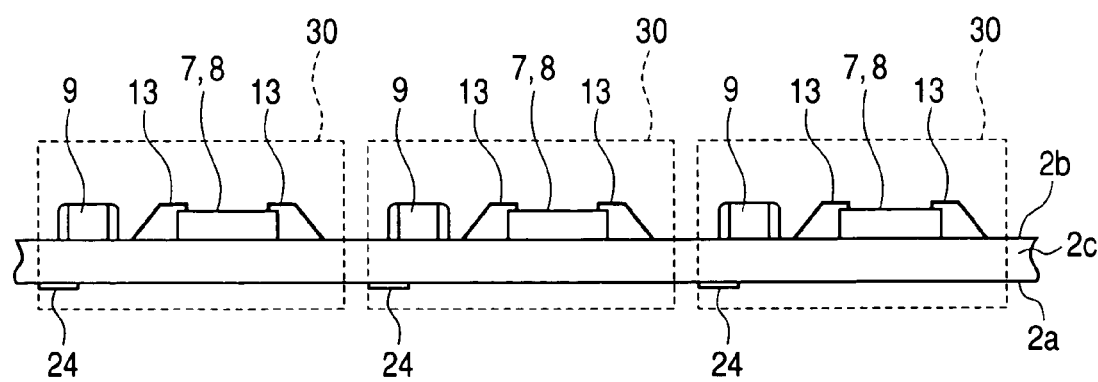
FIG. 3 is a side elevation view of the essential portion under the manufacturing step of FIG. 2.
Figure 4:
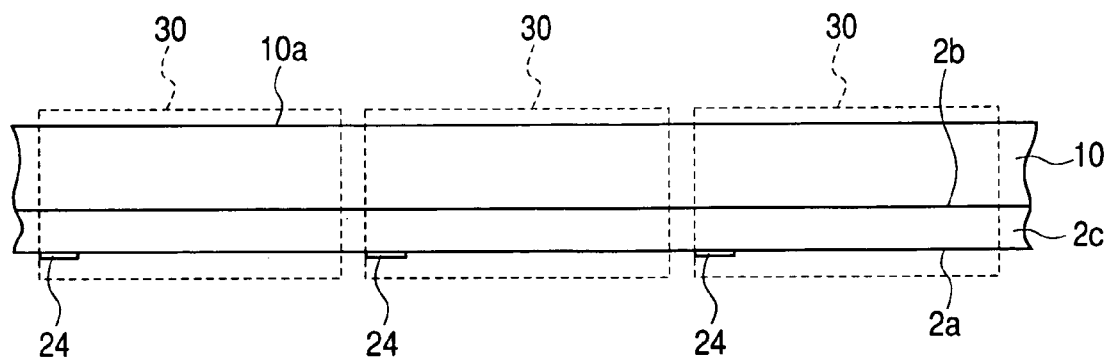
FIG. 4 is a side elevation view of the essential portion of the camera module under the manufacturing step following FIG. 3.
Figure 5:
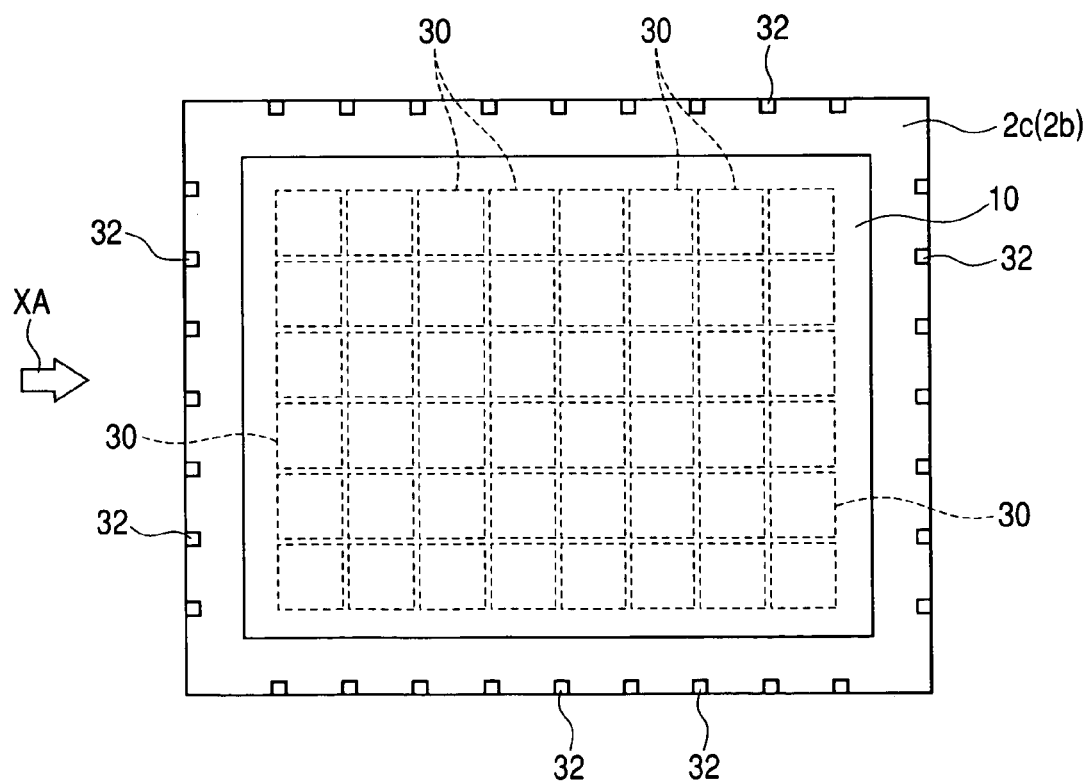
FIG. 5 is a total plan view under the manufacturing step of FIG. 4.

Next, the manufacturing step of the solid-state image sensing device of the present embodiment will be described. FIG. 2 is a total plan view of the solid-stage image sensing device of the present embodiment, namely a camera module 1 under the manufacturing step. FIG. 3 is a side elevation view of the essential portion of the same solid-state image sensing device. FIG. 4 is a side elevation view of the essential portion of the camera module 1 under the manufacturing step following FIG. 3. FIG. 5 is a total plan view under the manufacturing step corresponding to FIG. 4. The side elevation view of the essential portion of the wiring substrate 2c viewed horizontally from the direction indicated by the arrow mark XA of FIG. 2 corresponds to FIG. 3, while the side elevation view of the essential portion of the wiring substrate 2c viewed horizontally from the direction indicated by the arrow mark XA of FIG. 5 corresponds to FIG. 4.

First, as illustrated in FIG. 2 and FIG. 3, the wiring substrate (wiring substrate mother board) 2c is prepared. The wiring substrate 2c is a motherboard of the wiring substrate 2. This wiring substrate 2c is cut in the cutting step described later and each wiring substrate isolated as each product region (substrate region) 30 corresponds to the wiring substrate 2 of the camera module 1. The wiring substrate 2c has a structure that a plurality of product regions (substrate regions) 30 forming one camera module 1 are arranged in the shape of matrix. The wiring substrate 2c has a multilayer wiring structure formed by laminating an insulation layer consisting, for example, a resin material layer (for example, glass epoxy system resin material layer) and a wiring layer (conductive layer). This wiring substrate 2c may be formed, for example, by a subtractive method. Moreover, the terminal portion 24 is formed among the conductive portion formed on the surface 2a and rear surface 2b of the wiring substrate 2c but the terminals 12, 14 are eliminated to simplify the figure. Moreover, a plurality of flat and rectangular conductor patterns 32 are formed at the areas near the four sides of the front surface 2a (optical system component mounting surface) and rear surface 2b (system component mounting surface) of the wiring substrate 2c.

In each product region 30, the passive component 9 is mounted (loaded) on the rear surface (system component mounting surface) 2b of the wiring substrate 2c via a conductive joining material 15 such as solder (not illustrated in FIG. 3). The kind and the number of passive component 9 mounted to each product region 30 may be varied depending on the design. Thereafter, in each product region 30, the logic chip 7 and memory chip 8 are mounted (loaded) on the rear surface 2b of the wiring substrate 2c via a die bonding material (not illustrated). The logic chip 7 and memory chip 8 are mounted in each product region 30, but the logic chip 7 and memory chip 8 are integrated as one semiconductor chip in each product region 30 of FIG. 2 and FIG. 3 in order to simplify the figure.

Next, the (electrode pads 7a, 8a of) logic chip 7 and memory chip 8 of each product region 30 are electrically connected, with the wire bonding step, to the (electrode 14 of) rear surface 2b of the wiring substrate 2c via the bonding wire 13.

Next, as illustrated in FIG. 4 and FIG. 5, the mold step (simultaneous mold step, for example) is conducted to form the seal resin 10 on the rear surface 2b of the wiring substrate 2c covering the logic chip 7, memory chip 8, passive component 9 and bonding wire 13. The seal resin 10 is formed, for example, of a thermosetting resin material and may include a filler. In the profile of the present embodiment, the seal resin 10 is formed to simultaneously seal the electronic components of a plurality of product regions 30 (here, logic chip 7, memory chip 8 and passive component 9).

Figure 6:
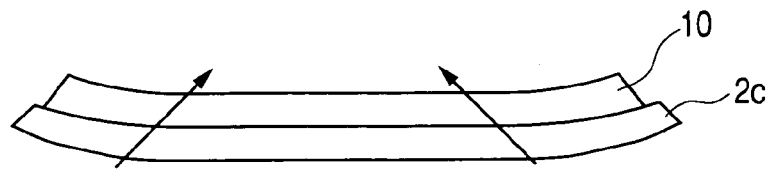
FIG. 6 is a diagram schematically illustrating a condition of wiring substrate warped by a stress.

When the seal resin 10 is formed on the rear surface 2b of the wiring substrate 2c, the wiring substrate 2c is easily warped. Particularly when the seal resin 10 is formed to the entire part of the rear surface (region including a plurality of product regions 30) 2b of the wiring substrate 2c with the simultaneous mold, warp of the wiring substrate 2c is easily increased. FIG. 6 is a schematic side elevation view for describing the wiring substrate 2c warped due to generation of stress when the seal resin 10 is formed on the wiring substrate 2c. The wiring substrate 2c will probably be warped as illustrated in FIG. 6 with stress generated by contraction of seal resin 10 when it is hardened.

Figure 7:
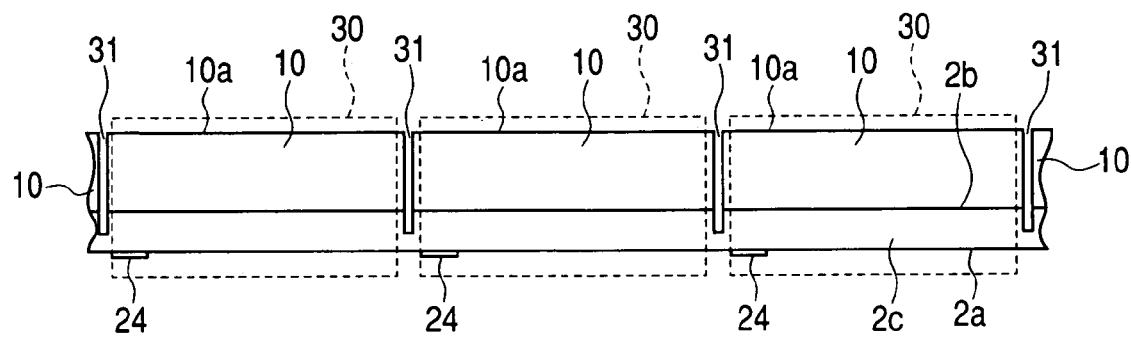
FIG. 7 is a side elevation view of the essential portion of the camera module under the manufacturing step following FIG. 4.
Figure 8:
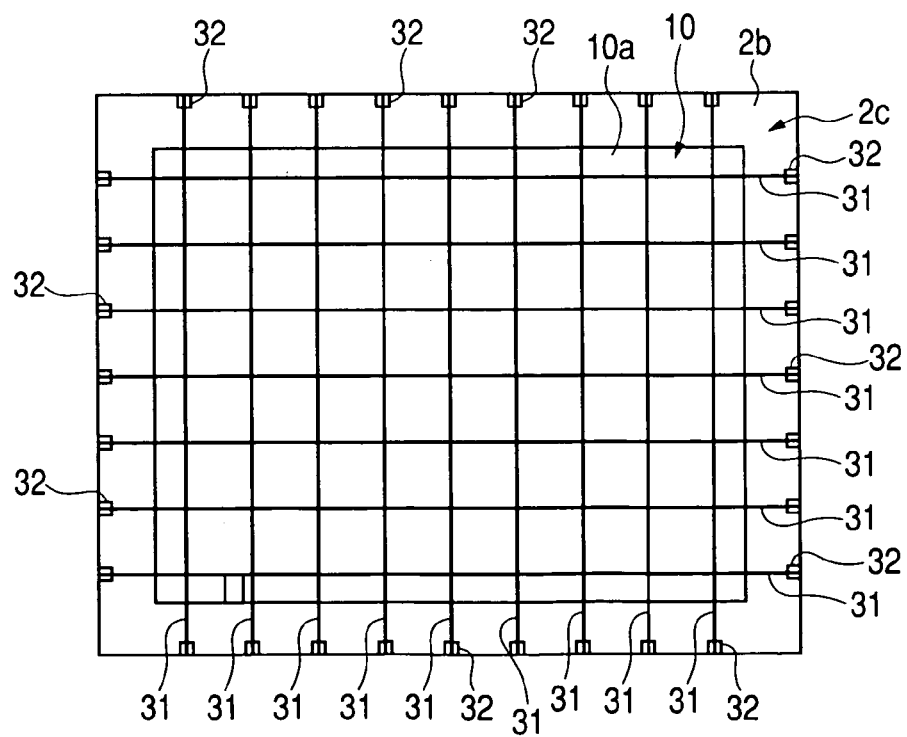
FIG. 8 is a total plan view under the manufacturing step of FIG. 7.

In the profile of this embodiment, warp of the wiring substrate 2c is alleviated by the flattening with the following steps. FIG. 7 and FIG. 8 are the side elevation view (FIG. 7) of the essential portion of the camera module 1 under the manufacturing step and the total plan view (FIG. 8) following FIG. 4 and FIG. 5.

After the seal resin 10 is formed as illustrated in FIG. 4 and FIG. 5, the seal resin 10 is subjected to the half-dicing (half-cut) from the upper surface 10a using a dicing saw (not illustrated) as illustrated in FIG. 7 and FIG. 8 in order to form a groove or cutting groove 31. As will be apparent from FIG. 7 and FIG. 8, cutting grooves 31 are formed among the product regions. Namely, the cutting grooves 31 are formed in two directions in the vertical and lateral directions for the rear surface 2b (namely, the upper surface 10a of the seal resin 10) in almost the shape of lattice. In this case, in order to prevent that the wiring substrate 2c is perfectly cut into individual pieces, the half-dicing is performed, in place of the full-dicing to perfectly cut the wiring substrate 2c, to leave at least a part of the wiring substrate 2c at the bottom part of the cutting grooves 31. It is enough here when the leaving thickness of the wiring substrate 2c at the bottom part of the cutting groove 31 is set to a value (about 0.2 mm, for example) which does not reduce the strength of the wiring substrate 2c. Moreover, in this half-dicing step, it is possible to introduce the wet dicing in which dicing is performed while water is supplied to the dicing blade. Moreover, the conductor pattern 32 of the substrate 2c may be used for alignment (eye mark) of the half-dicing.

When the seal resin 10 is formed on the rear surface 2b of the wiring substrate 2c, the wiring substrate 2c is easily warped and particularly when the seal resin 10 is formed on the entire part of the rear surface 2b of the wiring substrate 2c with the simultaneous molding including the product region 30, the wiring substrate 2c is easily warped to a large extent. In the profile of this embodiment, warp of the wiring substrate 2c is reduced (alleviated) by forming the cutting groove 31 to the seal resin 10 and the wiring substrate 2c can be further flattened. If the bottom part of the cutting groove 31 does not reach the wiring substrate 2c (namely, depth of the cutting groove 31 is smaller than the thickness of the seal resin 10), the wiring substrate 2c can be more flattened by reducing (alleviating) the warp of the wiring substrate 2c. However, when the bottom part of the cutting groove 31 reaches the wiring substrate 2c (namely, depth of the cutting groove 31 is larger than the thickness of the seal resin 10), it is preferable because warp of the wiring substrate 2 can be reduced (alleviated) and thereby the wiring substrate 2c can be more flattened. Moreover, it is further preferable to form the cutting groove 31 almost in the shape of lattice as illustrated in FIG. 8 because warp of the wiring substrate 2c may be uniformed in almost the entire part of the wiring substrate 2c.

In the profile of the present embodiment, warp or twist of the wiring substrate 2c can be reduced and flattened by forming the cutting groove 31. If the wiring substrate 2c is warped and twisted, the bonding wire 11 cannot be joined successfully in some cases in the joining step of the bonding wire 11 after the sensor chip 3 is mounted on the surface 2a of the wiring substrate 2 described later. Meanwhile, in the profile of the present embodiment, since the wring substrate 2c can be flattened through alleviation of warp and twist by forming the cutting groove 31, bondability of the bonding wire 11 can be improved. Therefore, the manufacturing yield of the camera module 1 can be improved. Moreover, since the wiring substrate 2c is further flattened, generation of gap between the lens mount 4 and wiring substrate 2c can be prevented when the lens mount 4 is bonded to the wiring substrate 2c as will be described later. Accordingly, entry of foreign matter into the lens mount 4 through the gap between the wiring substrate 2c (wiring substrate 2) and the lens mount 4 can also be prevented, and adhesion of foreign matter to the sensor chip 3 and IR filter 16 can also be prevented. Therefore, the manufacturing yield of the camera module 1 can also be improved.

Figure 9:
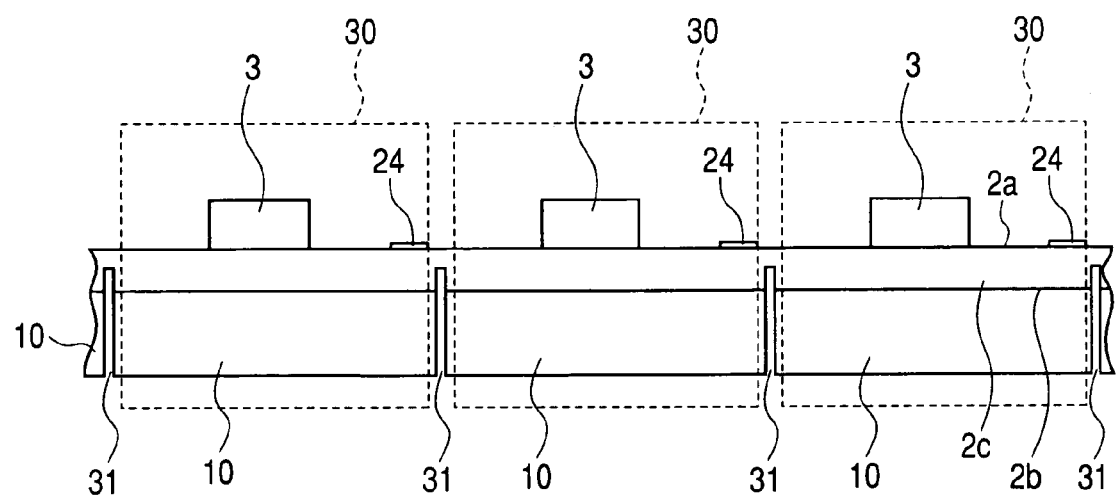
FIG. 9 is a side elevation view of the essential portion of the camera module under the manufacturing step following FIG. 7.
Figure 10:
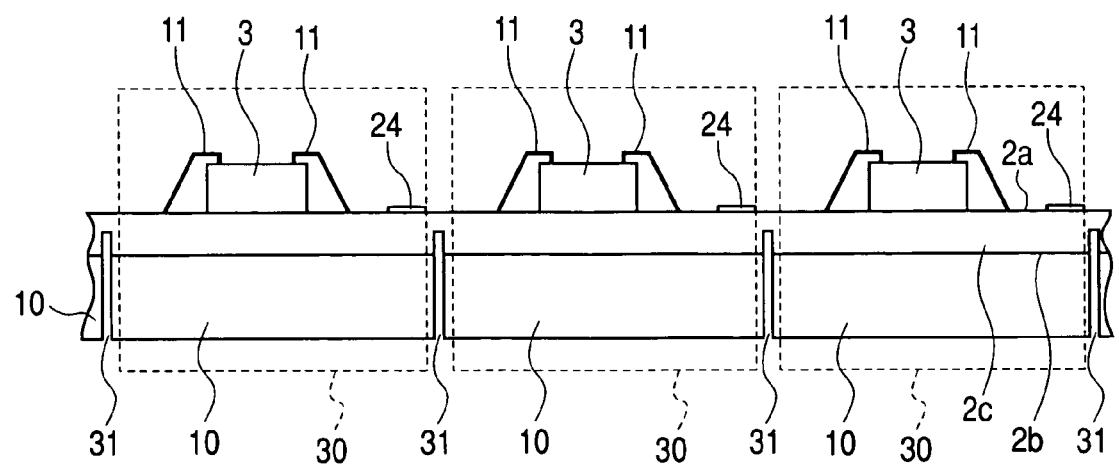
FIG. 10 is a side elevation view of the essential portion of the camera module under the manufacturing step following FIG. 9.

FIG. 9 and FIG. 10 are side elevation views of the essential portion of the camera module 1 under the manufacturing step following FIG. 7.

After the half-dicing step as described above, the wiring substrate 2c is placed upside down as illustrated in FIG. 9 so that the front surface (optical system component mounting surface) 2a of the wiring substrate 2c as the main surface in the opposite side of the rear surface 2b is placed upward. Thereafter, the sensor chip 3 is mounted (loaded) via the die-bonding material (not illustrated) on the surface 2a of the wiring substrate 2c in each product region 30.

Next, as illustrated in FIG. 10, the wire bonding step is executed to electrically connect the (electrode pad 3a of) sensor chip 3 of each product region 30 via the bonding wire 11.

Figure 11:
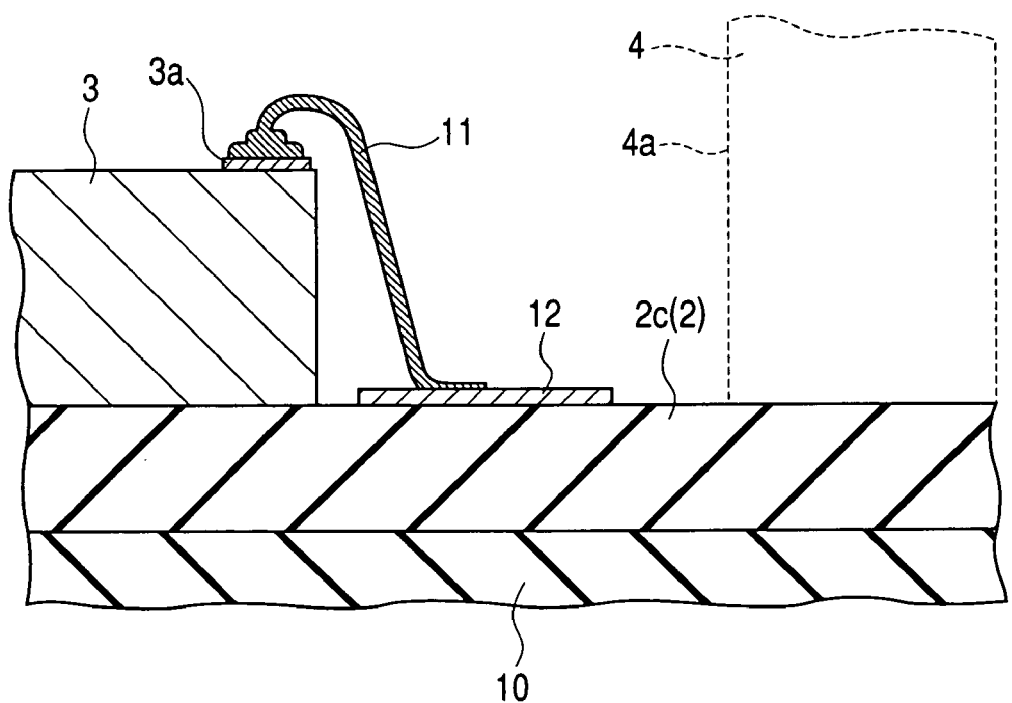
FIG. 11 is a diagram illustrating a wire bonding step, as a comparison example, between a sensor chip and the wiring substrate.
Figure 12:
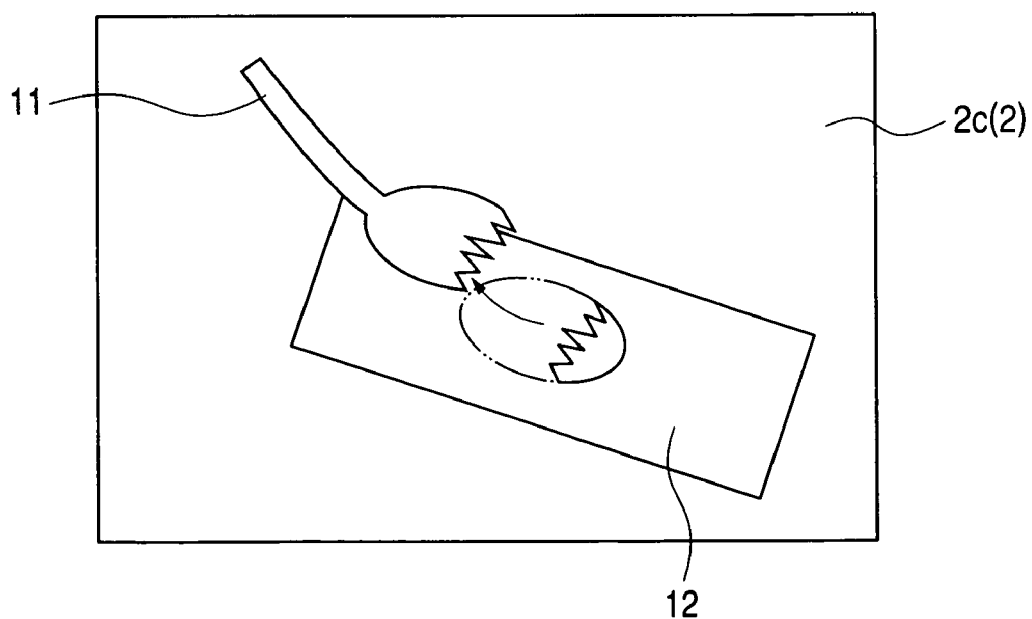
FIG. 12 is a diagram schematically illustrating the condition where the bonding wire is partly peeled.
Figure 13:
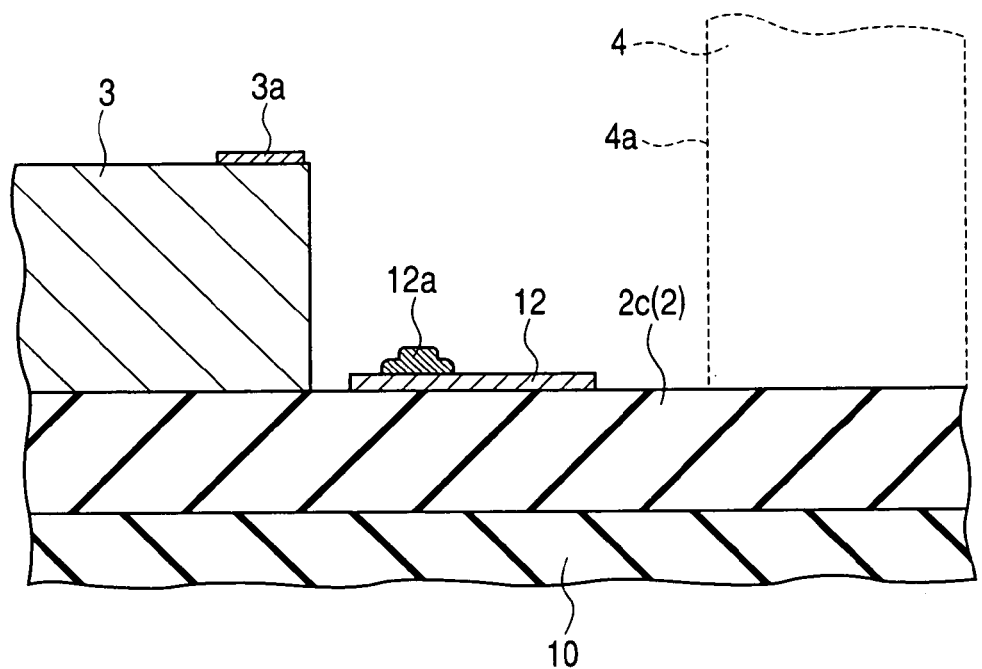
FIG. 13 is a diagram illustrating the wire bonding step between the sensor chip and the wiring substrate in the camera module as the embodiment of the present invention.
Figure 14:
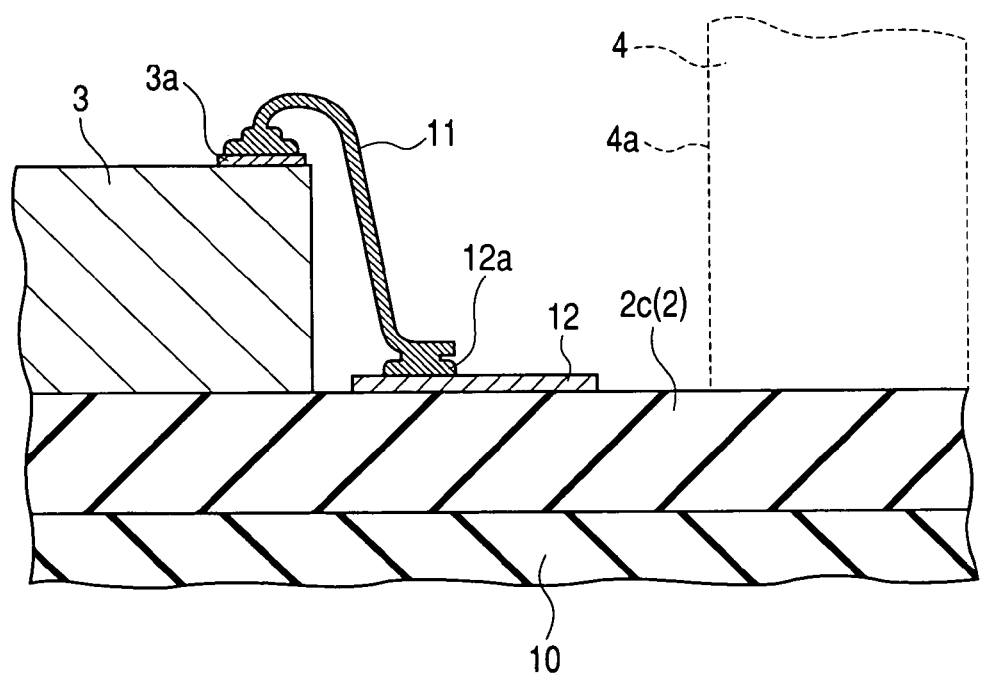
FIG. 14 is a diagram illustrating the wire bonding step between the sensor chip and the wiring substrate in the camera module as the embodiment of the present invention.

FIG. 11 is a diagram (cross-sectional view of the essential portion) illustrating the wire bonding step as an comparison example between the sensor chip 3 and wiring substrate 2c. FIG. 12 is a schematic diagram illustrating the condition where the bonding wire is peeled. FIG. 13 and FIG. 14 are diagrams (cross-sectional views of the essential portion) illustrating the wiring bonding step between the sensor chip 3 and wiring substrate 2c in the profile of the present invention.

As illustrated in FIG. 11, it is preferable for the electrode 12 connected to the bonding wire 11 to be formed in the area comparatively nearer to the sensor chip 3 at the surface 2a of the wiring substrate 2c for reduction of the size on the plane of the lens mount 4 by reducing the distance up to the sensor chip 3 from the internal wall 4a of the lens mount 4. Accordingly, reduction in size of the camera module 1 can be realized. However, when the electrode 12 is formed at the area nearer to the sensor chip 3 at the surface 2a of the wiring substrate 2c, an angle formed by the bonding wire 11 and the electrode 12 is sharpened (for example, becomes nearer to vertical), and thereby a bending stress to the bonding wire 11 becomes large. Therefore, a connection strength between the bonding wire 11 and electrode 12 will probably be reduced. This phenomenon becomes more distinctive when the thickness of the sensor chip 3 (thickness of the wiring substrate 2c in the vertical direction to the surface 2a) is large. Moreover, the electrode 12 is formed, for example, through the plating of gold (Au) on the copper film. When the non-electrolyte plating method is introduced, for example, when the surface layer of the electrode 12 is formed of the non-electrolyte Au plating film, the connection strength between the bonding wire 11 and electrode 12 will probably be further reduced because the electrode 12 becomes thinner comparatively and purity of the plated film is comparatively lower. Thereby, it is also probable that the bonding wire 11 is peeled from the electrode 12 as illustrated in FIG. 12 and therefore reliability of camera module is probably reduced, resulting in the reduction of the manufacturing yield thereof. Here, it is also conceivable to form the electrode 12 with the electrolyte plating method. However, in this case, a plating wire is laid complicatedly to form a plating film on the wiring substrate 2c, and moreover manufacturing cost will be increased.

In the profile of the present embodiment, as illustrated in FIG. 13, a stud bump (bump electrode) 12a consisting of gold (Au) is formed on the electrode 12 formed at the surface 2a of the wiring substrate 2c. The stud bump 12a can be formed by pressing the end point of the bonding wire consisting of gold (Au) to the electrode 12 during application of ultrasonic wave and then pulling the bonding wire for the cutting thereof, for example, using a wire bonding device to form the bonding wire 11. Even if the surface layer of the electrode 12 is formed of a non-electrolyte plating film, for example, a non-electrolyte Au plating film, since the stud bump 12a which is thicker than the non-electrolyte Au plating film is formed on the non-electrolyte Au plating film, the Au-Au coupling may be promoted using the ultrasonic wave power and the bonding (coupling) strength between the stud bump 12a and electrode 12 may be improved. Moreover, the stud bump 12a may be formed relatively thicker than the electrode 12 and moreover it may also be formed of a high purity metal (for example, high purity gold (Au)). After formation of the stub bump 12a, the electrode pad 3a of the sensor chip 3 is electrically connected to the stud bump 12a formed on the electrode 12 of the wiring substrate 2c via the bonding wire 11 using the wire bonding device which is similar to that used to form the stud bump 12a as illustrated in FIG. 14. In this case, one end of the bonding wire 11 is connected first to the electrode pad 3a of the sensor chip 3 and the other end of the bonding wire 11 is then connected to the stud bump 12a formed on the electrode 12.

In the profile of the present embodiment, since the stud bump 12a is formed on the electrode 12 and the bonding wire 11 is connected to this stud bump 12a, the bonding wire 11 can be connected to the stud bump 12a consisting of a high purity metal (gold) which is thicker than the non-electrolyte Au plating film and the connection strength between the bonding wire 11 and electrode 12 (namely, stud bump 12a) can be enhanced. Therefore, peeling of the bonding wire 11 from the electrode 12 (stud bump 12a) as illustrated in FIG. 12 can be suppressed or prevented. Accordingly, reliability of cameral module 1 can be improved and manufacturing yield thereof can also be improved. In addition, even if the angle formed by the bonding wire 11 and electrode 12 is smaller (for example becomes near to vertical) and a bending stress on the bonding wire 11 becomes large because the electrode 12 is formed to the area comparatively nearer to the sensor chip 3 or a comparatively thick sensor chip 3 is used, the connection strength between the bonding wire 11 and electrode 12 (stud bump 12a) can be improved by connecting the bonding wire 11 to the stud bump 12a on the electrode 12 and peeling of the bonding wire 11 from the electrode 12 (stud bump 12a) can be suppressed or prevented. Therefore, the distance up to the sensor chip 3 from the internal wall 4a of the lens mount 4 can be shortened. Accordingly, the size on the plane of lens mount 4 can be reduced and thereby the camera module 1 can be reduced in size. Moreover, a comparatively thick sensor chip 3 may also be used to widen the selection possibility of the sensor chip 3.

Moreover, it is more preferable when the surface layer of the electrode 12, the stud bump 12a and the bonding wire 11 are formed of the same metal material such as gold. Thereby, the joining strength between the electrode 12 and stud bump 12a and between the stud bump 12a and bonding wire 11 can be improved.

Figure 15:
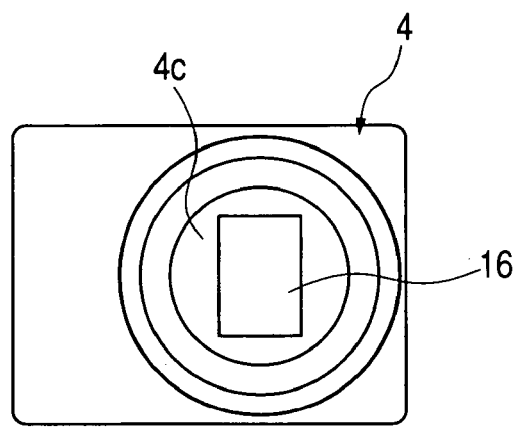
FIG. 15 is an upper plan view of a lens mount.
Figure 16:
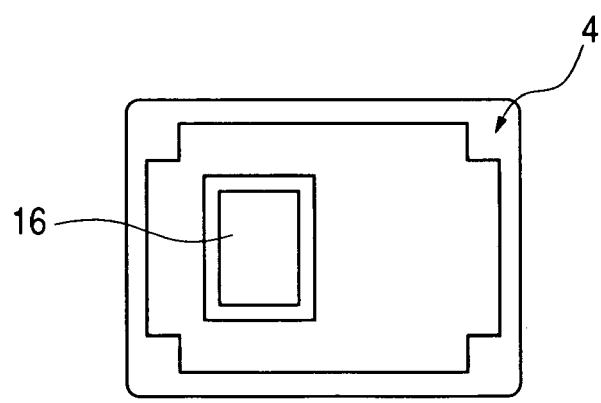
FIG. 16 is a lower plan view of the lens mount.
Figure 17:
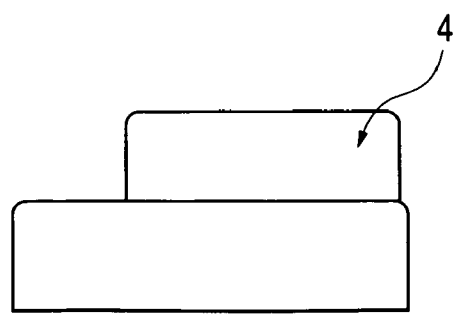
FIG. 17 is a side elevation view of the lens mount.
Figure 18:
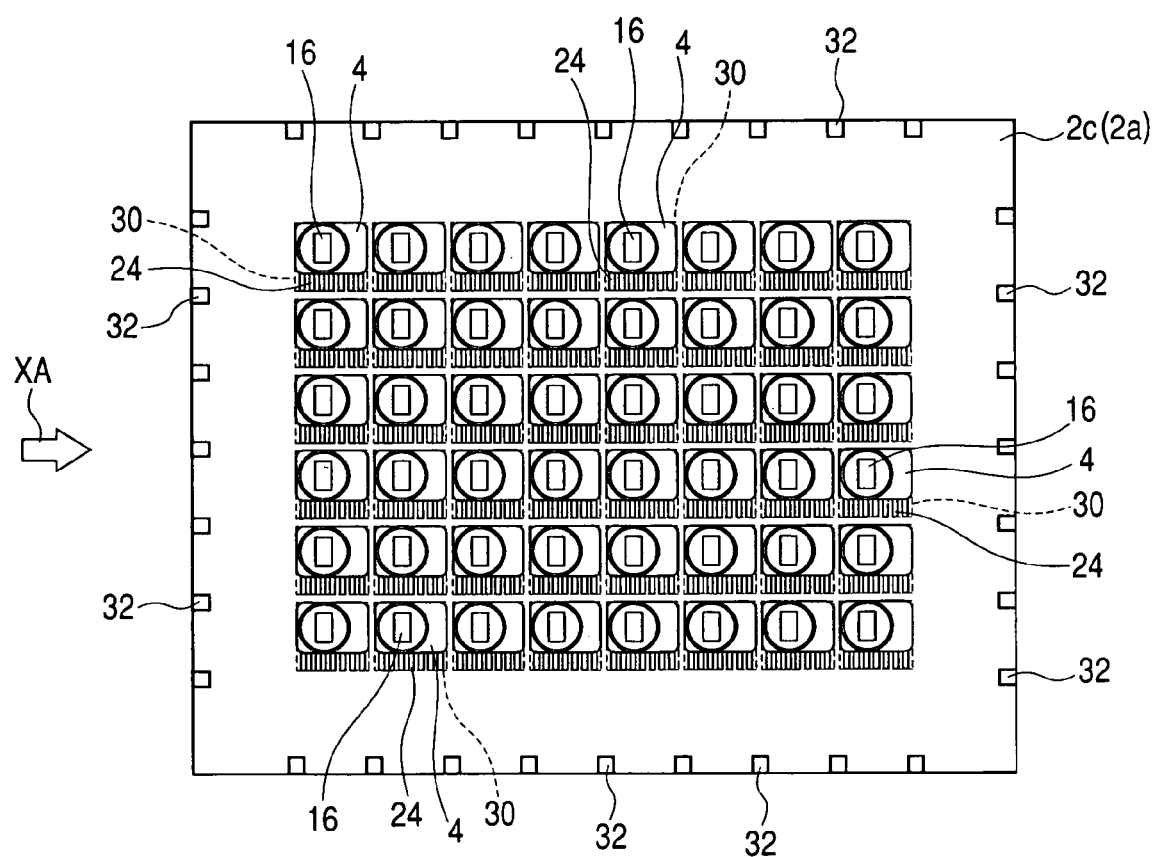
FIG. 18 is a total plan view illustrating the condition where the lens mounts are mounted on the wiring substrate.
Figure 19:
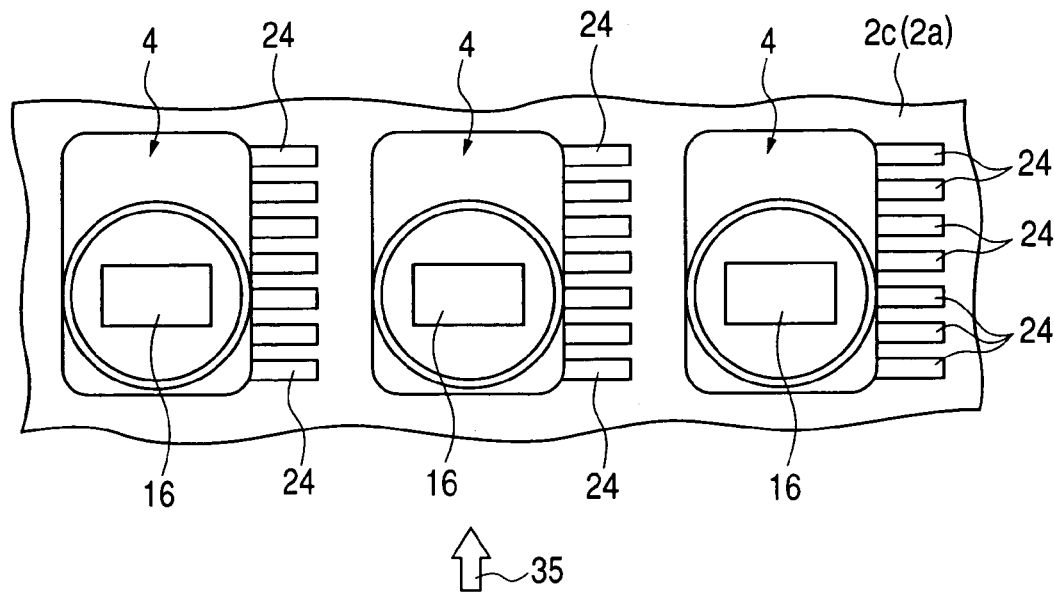
FIG. 19 is a plan view of the essential portion illustrating the condition where the lens mounts are mounted on the wiring substrate.
Figure 20:
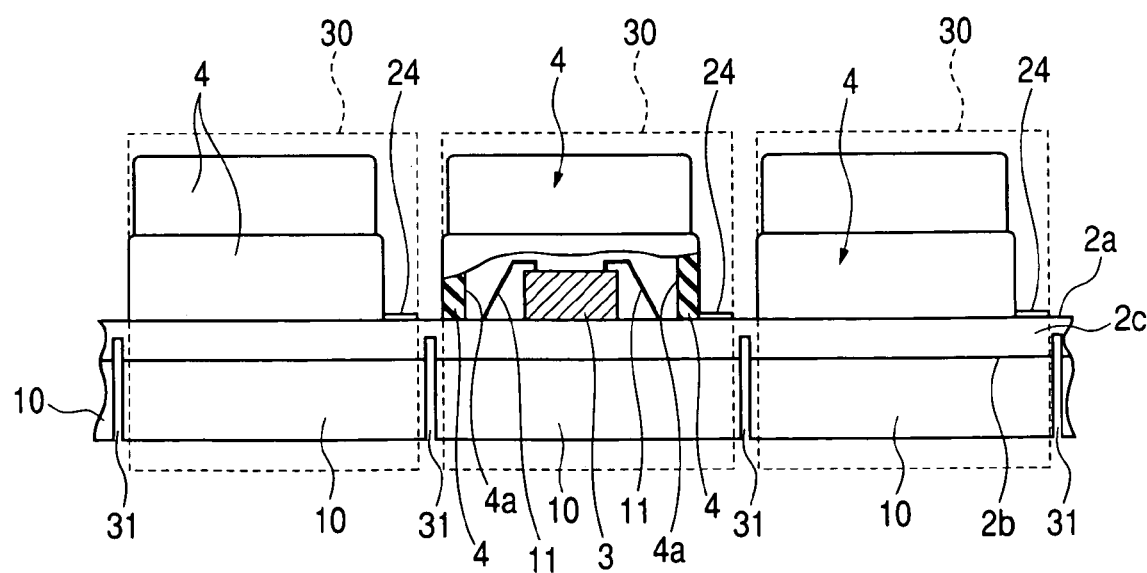
FIG. 20 is a partially broken side elevation view illustrating the condition where the lens mounts are mounted on the wiring substrate.

After the wire bonding step between the sensor chip 3 and wiring substrate 2c, the lens mount 4 is mounted and bonded on the surface 2a of the wiring substrate 2c in each product region 30. FIG. 15 is an upper plan view of the lens mount 4. FIG. 16 is a lower plan view of the lens mount 4. FIG. 17 is a side elevation view of the lens mount 4. FIG. 18 is a total plan view illustrating the condition that the lens mount 4 is mounted (bonded) on the wiring substrate 2c. FIG. 19 and FIG. 20 is a plan view of the essential portion (FIG. 19) and a partially broken side elevation view (FIG. 20) of the condition where the lens mount 4 is mounted (loaded) on the wiring substrate 2c. FIG. 20 is a side elevation view of the essential portion of the wiring substrate 2c viewed horizontally from the direction indicated by the arrow mark XA of FIG. 18 and a side elevation view from the direction indicated by the arrow mark 35 of FIG. 19, corresponding to the condition where the lens mount 4 is mounted (bonded) to the structure of FIG. 10. The direction of arrow mark XA of FIG. 18 and the direction of arrow mark 35 of FIG. 19 correspond to the same direction to the substrate 2c.

As will be apparent from FIG. 20, the lens mount 4 is mounted on the surface of the wiring substrate 2c to accommodate the sensor chip 3 and bonding wire 11 within the lens mount 4 in each product region 30. For example, the lens mount 4 can be bonded to the wiring substrate 2c with a thermosetting bonding agent. Within the lens mount 4, the IR filter 16 is held so that the lens mount 4 is allocated on the sensor chip 3, when it is bonded to the wiring substrate 2c.

Figure 21:
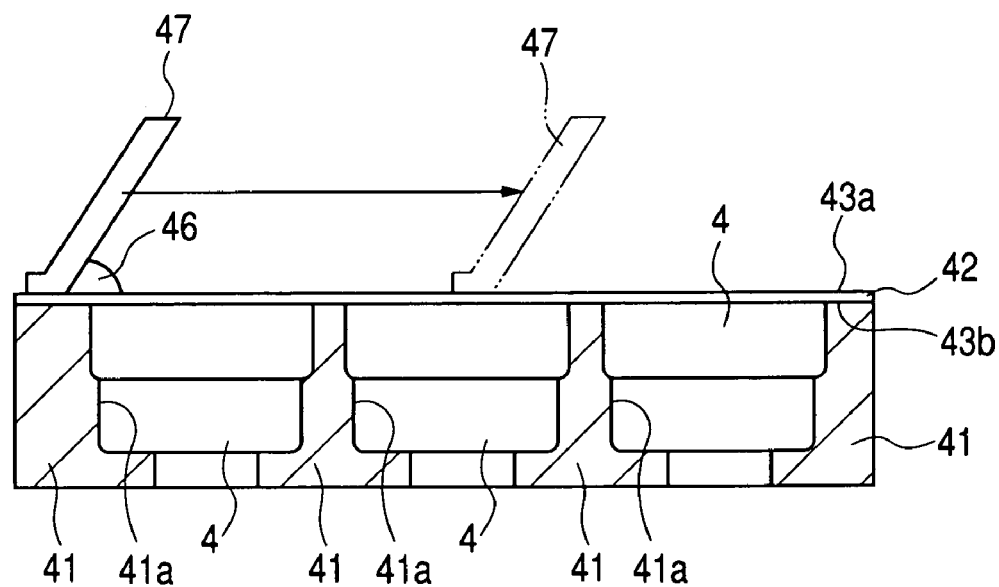
FIG. 21 is a diagram illustrating the step where the lens mounts are coated with a bonding material for bonding to the wiring substrate.

FIG. 21 is a diagram for describing the step to coat the lens mount 4 with a bonding material for bonding to the wiring substrate 2c.

As illustrated in FIG. 21, the lens mount 4 is allocated in each recess 41a of the lens mount jig 41 including recesses 41a corresponding to the external shape of the lens mount 4. In this case, the lens mount 4 is accommodated within the recess 41a to place upward the bonding surface 4b to be bonded to the wiring substrate 2c of the lens mount 4 and it is then held or temporarily fixed with vacuum suction. Thereafter, a mask 42 is allocated on the surface of the lens mount jig 41 holding the lens mount 4 to the recess 41a.

Figure 22:
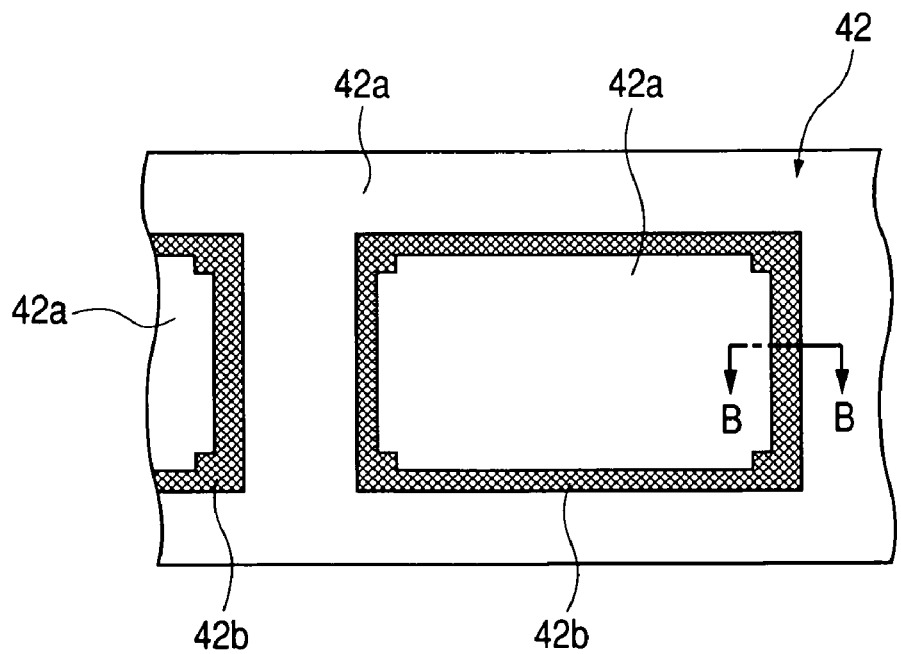
FIG. 22 is a plan view of the essential portion illustrating the condition where a mask is allocated on a lens mount jig.
Figure 23:
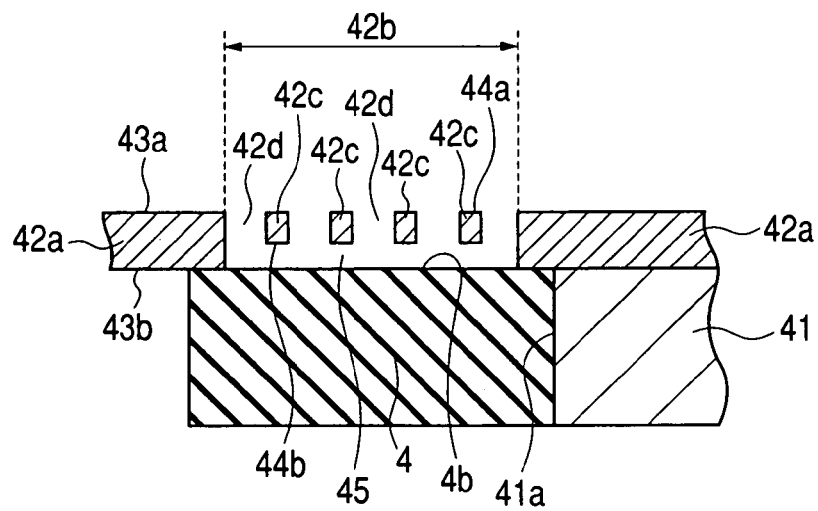
FIG. 23 is a cross-sectional view of the essential portion of FIG. 22.

FIG. 22 is a plan view of the essential portion in the condition where the mask 42 is allocated on the lens mount jig 41. FIG. 23 is a cross-sectional view of the essential portion thereof. The cross-section along the line B-B of FIG. 22 almost corresponds to FIG. 23.

For example, the mask 42 is formed of a metal material, as illustrated in FIG. 22 and FIG. 23, including a mask portion 42a as a flat metal region and a printing region (coating region) 42b where the flat metal plate forming the mask portion 42a is patterned in the shape of mesh, for example, with the etching process. The printing region 42b has the shape almost corresponding to the bonding surface 4b of the lens mount 4.

The mask portion 42a of the mask 42 is the region not including aperture. The printing region 42b of the mask 42 includes a remaining mesh type metal material portion 42c. A bonding material is coated (printed) on the bonding surface 4b of the lens mount 4 located in the lower side of the printing region 42b through a large number of small apertures of the printing region 42b, namely a large number of fine gaps (apertures) 42d between the metal material portions 42c. The mask 42 is formed in the thickness of about 130 μm, while the mesh type metal material portions 42c remaining in the printing region 42b is formed thinner than the mask, for example, in the thickness of about 70 μm. An upper surface 43a of the mask 42 (main surface in the opposite side of the side opposing to the lens mount 4) is set on the same plane to the upper surface 44a of the mesh type metal material portion 42c remaining in the printing region 42b, but the lower surface 43b of the mask 42 (main surface in the side opposing to the lens mount 4) is not on the same plane as the lower surface 44b of the mesh type metal material portion 42c remaining in the printing region 42b. In the printing region 42b of the mask 42, a recess portion 45 (for example, about 60 μm) is formed in the side of lower surface 43b (44b)

For example, the mask 42 can be formed by forming the recess portion 45 with half-etching, from the side of the lower surface 43b, of the region as a whole (for example, about 60 μm) corresponding to the printing region 42b of the metal plate to form the mask 42, simultaneously leaving the mesh type metal material portion 42c through the selective etching of the printing region 42b, and then removing the other portion (the portion other than the metal material portion 42c) in the printing region 42b.

When the mask 42 is allocated on the lens mount jig 41, the mask 42 is allocated (positioned) to realize alignment of the bonding surface 4b of the lens mount 4 and the printing region 42b of the mask 42. Thereafter, as illustrated in FIG. 21, the bonding material 46 of the predetermined amount is allocated on the upper surface 43a of the mask 42, this bonding material 46 is extended (squeezed) with movement of a squeeze 47 and the bonding material 46 is selectively coated to the bonding surface 4b of the lens mount 4 via the mask 42.

Figure 24:
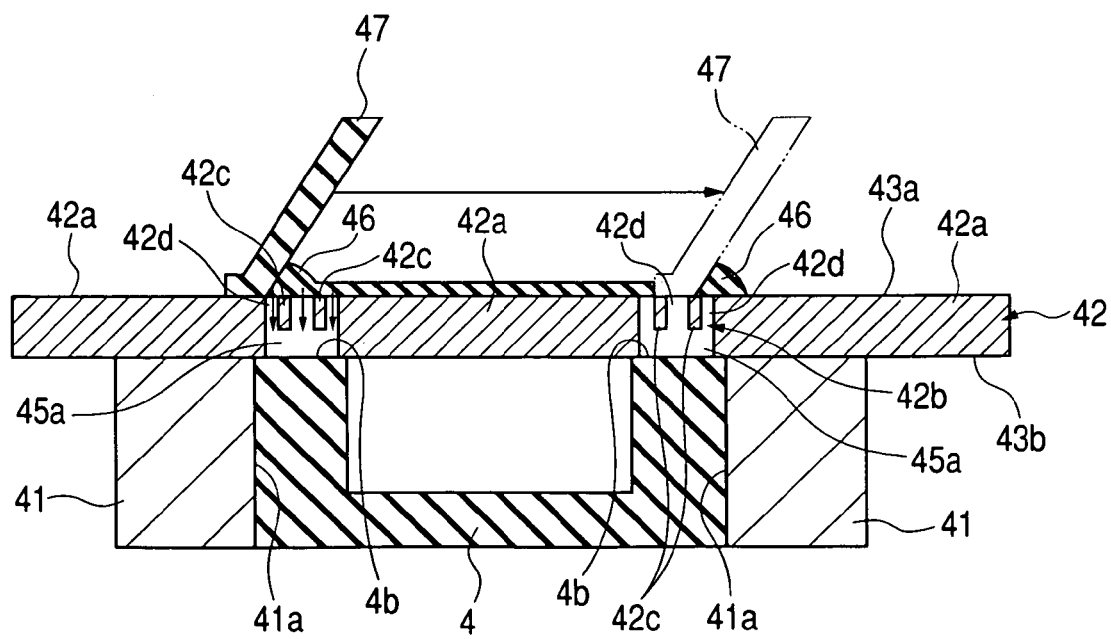
FIG. 24 is a schematic cross-sectional view for describing the step to coat the lens mount with the bonding material.
Figure 25:
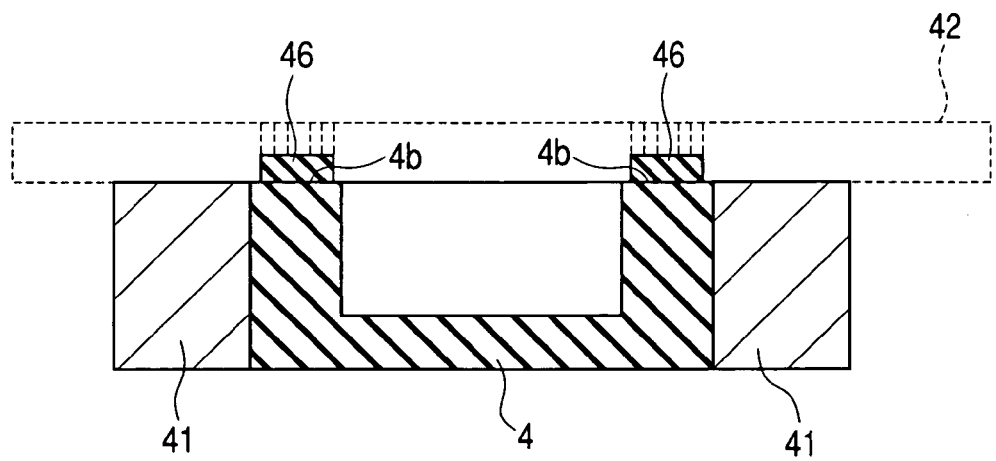
FIG. 25 is a schematic cross-sectional view for describing the step to coat the lens mount with the bonding material.

FIG. 24 and FIG. 25 are schematic cross-sectional views for describing the coating step where the lens mount 4 is coated with the bonding material 46.

As illustrated in FIG. 24, when the bonding material 46 is extended with the squeeze 47, the bonding material 46 placed on the upper surface 43a of the mask 42 is extended (squeezed) with the squeeze 47 passing the printing region 42b. In the printing region 42b patterned like a mesh, the boding material 46 is pushed downward passing the fine gaps (apertures) 42d among the metal material portions 42c. Namely, the bonding material 46 controlled to move on the mask 42 with the squeeze 47 is adhered to the bonding surface 4b of the lens mount 4 passing through the mesh type pattern of the printing region 42b.

A space 45a corresponding to the recess 45 (for example, about 60 $\mu$m) exists between the bonding surface 4b of the lens mount 4 and the metal material portion 42c of the printing region 42b and this space 45a is filled with the bonding material 46. As illustrated in FIG. 25, the bonding material 46 filling the space 45a remains as the boding material layer on the bonding surface 4b of the lens mount 4 because the mask 42 is isolated from the lens mount jig 41 (lens mount 4). Accordingly, the bonding material 46 is coated or printed on the bonding surface 4b of the lens mount 4. The bonding material 46 filling the gap 42d among the metal material portions 42c of the printing region 42b moves together with the mask 42 and is not adhered to the bonding surface 4b of the lens mount 4.

Thickness of the bonding material layer (bonding material 46) coated on the bonding surface 4b of the lens mount 4 corresponds to the thickness of space 45 (thickness in the vertical direction to the upper surface 43a or lower surface 43b of the mask 42), namely to the thickness of the recess 45 of the mask 42 (thickness in the vertical direction to the upper surface 43a or lower surface 43b of the mask 42). Therefore, thickness of the bonding material layer (bonding material 46) coated on the bonding surface 4b of the lens mount 4 can be controlled by adjusting the thickness of the recess 45 of the mask 42. Therefore, the bonding material layer (bonding material 46) can be formed in the uniform thickness on the bonding surface 4b of each lens mount 4. When the bonding material 46 is coated in the small amount on the bonding surface 4b of the lens mount 4, it is probable that bonding failure occurs between the lens mount 4 and the wiring substrate 2c. Moreover, if the bonding material 46 is coated in the excessive amount, the bonding material 46 is adhered to the terminal portion 24 of the wiring substrate 2c when the lens mount 4 is bonded to the wiring substrate 2c and thereby failure of electrical connection will probably be generated between the flexible substrate 21 and the terminal portion 24. However, in this embodiment, since the bonding material layer (bonding material 46) can be formed in the uniform thickness with excellent controllability on the bonding surface 4b of the leans mount 4, occurrence of failure in the bonding and electrical connection may be suppressed or controlled. Therefore, reliability of cameral module can be improved and manufacturing yield thereof can also be improved.

If there is no mesh type metal material portion 42c in the printing region 42b and the aperture is formed to the entire part of the printing region 42b, unlike the profile of the present invention, the coupling portion between the mask portion 42a outside the printing region 42b and the mask portion 42a within the printing region 42b is required and the bonding material 46 cannot be coated to the lower side of the coupling portion. Thereby, the region not coated with the bonding material 46 appears in the bonding surface 4b of the lens mount 4. Therefore, when the lens mount 4 is bonded to the wiring substrate 2c, a gap will probably be generated between the lens mount 4 and the wiring substrate 2c. If a gap exists between the lens mount 4 and the wiring substrate 2c, a foreign matter will enter the inside of lens mount 4 resulting in the probability that foreign matters will adhere on the sensor chip 3 and IR filter 16. Adhesion of a foreign matter on the sensor chip 3 will generate a failure by black point (black point failure) in the image which is taken and displayed using the camera module, while adhesion of a foreign matter on the IR filter 16 will cause a failure by stain (ambiguous stain failure) in the image taken and displayed using the camera module. Therefore, entry of a foreign matter into the lens mount 4 (adhesion of foreign matter on the sensor chip 3 and IR filter 16) will lower the manufacturing yield of the camera module.

In the profile of the present embodiment, since the bonding material layer is printed on the bonding surface 4b of the lens mount 4 with the squeeze 47 using the mask 42 including the printing region 42b patterned like a mesh, the bonding material layer of the boding material 46 can be formed uniformly on the bonding surface 4b of the lens mount 4. Therefore, when the lens mount 4 is bonded to the wiring substrate 2c, generation of a gap between the lens mount 4 and wiring substrate 2c can be prevented. Accordingly, entry of a foreign matter into the lens mount 4 can be prevented and adhesion of a foreign matter on the sensor chip 3 and IR filter 16 can also be suppressed and prevented. Thereby, reliability of camera module can be improved and the manufacturing yield thereof can also be improved. In addition, the bonding material 46 can be supplied stably to the bonding surface 4b of the lens mount 4 using a low price jig and thereby the manufacturing cost can also be lowered.

Moreover, as illustrated in FIG. 23, width of the printing region 42b of mask 42 is preferably smaller a little than the width of the bonding surface 4b of the lens mount 4. For example, the width of the bonding surface 4b of the lens mount 4 is about 0.6 to 0.8 mm, while the width of the printing region 42b of the mask 42 is smaller than the width of the bonding surface 4b of the lens mount 4 by about 100 $\mu$m. Thereby, adhesion of the bonding material 46 to the internal wall or external wall of the lens mount 4 exceeding the bonding surface 4b of the lens mount 4 can be prevented. Moreover, the bonding material 46 is preferably formed of a thermosetting bonding material. Therefore, hardening of the bonding material 46 on the mask 42 can be prevented and thereby workability can be improved. Moreover, manufacturing cost can also be reduced because the mask 42 can be used repeatedly.

Figure 26:
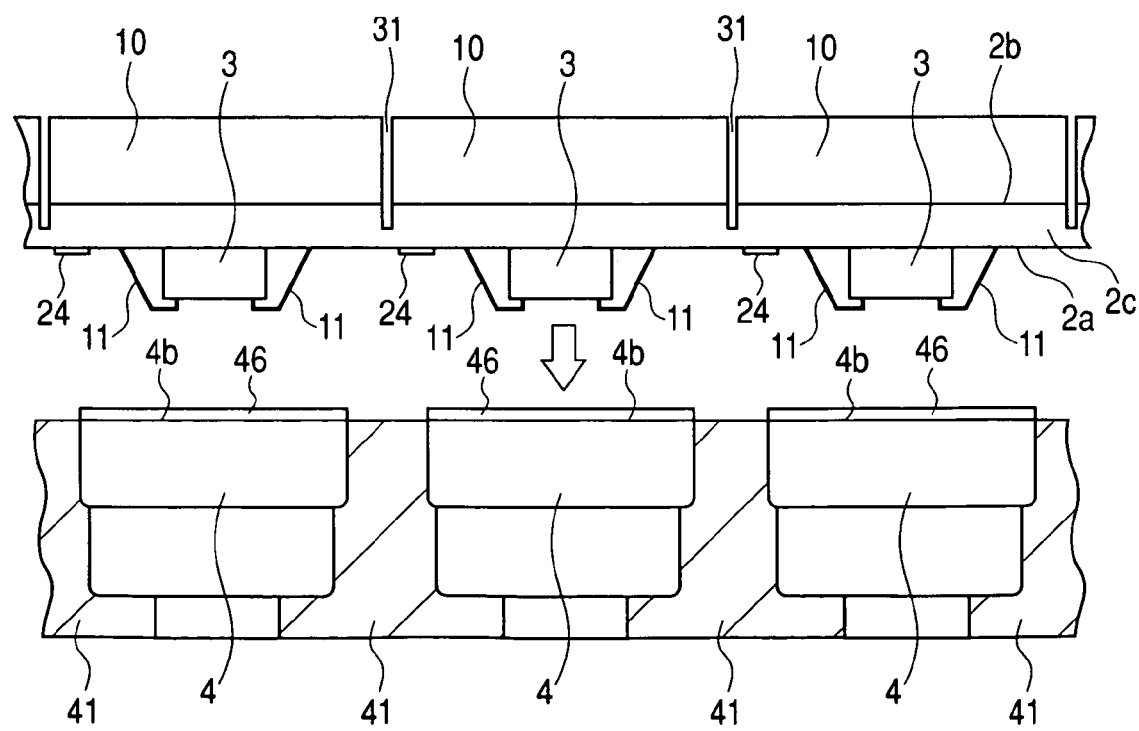
FIG. 26 is a diagram for describing the step to bond the lens mounts coated with the bonding material on the wiring substrate.
Figure 27:
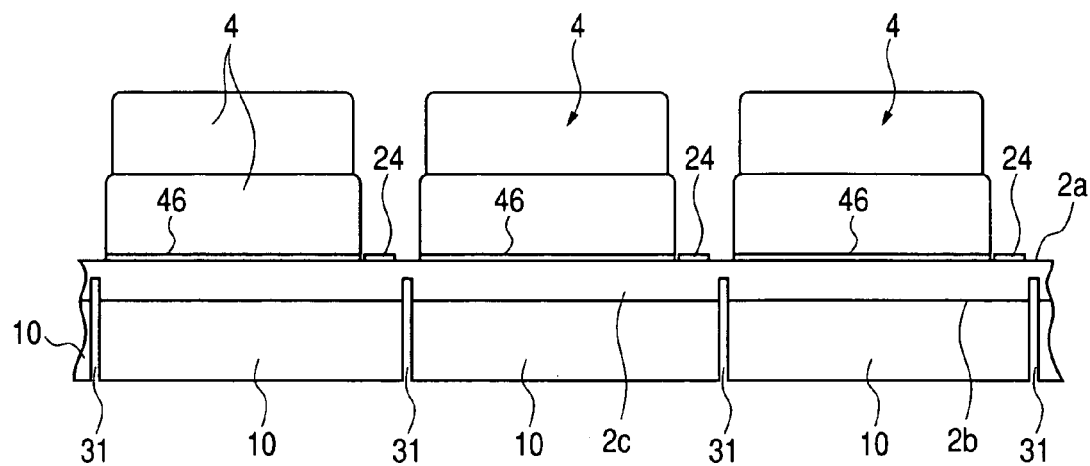
FIG. 27 is a diagram for describing the step to bond the lens mounts coated with the bonding material on the wiring substrate.

FIG. 26 and FIG. 27 are diagrams for describing the bonding step to bond the lens mount 4 coated with the bonding material 46 to the wiring substrate 2c.

After the bonding material 46 is coated (printed) to the bonding surface 4b of the lens mount 4 as described above, this lens mount 4 and the surface 2a of the wiring substrate 2c having formed the bonding wire 11 by mounting the sensor chip 3 as described above are bonded. For example, the surface 2a of the wiring substrate 2c is pressed to the lens mount 4 held by the lens mount jig 41 and coated with the bonding material 46 as illustrated in FIG. 26. While the surface 2a of the wiring substrate 2c is pressed toward the boding surface of the lens mount 4, the heat treatment is performed. Thereby, the bonding material 46 is hardened and the lens mount 4 is bonded (fixed) to the surface 2a of the wiring surface 2c. After the bonding material 46 is hardened, the lens mount 4 bonded to the wiring substrate 2c is removed from the lens mount jig 41 and the wiring substrate 2c is then placed upside down. As a result, the structure illustrated in FIG. 27 can be obtained.

Figure 28:
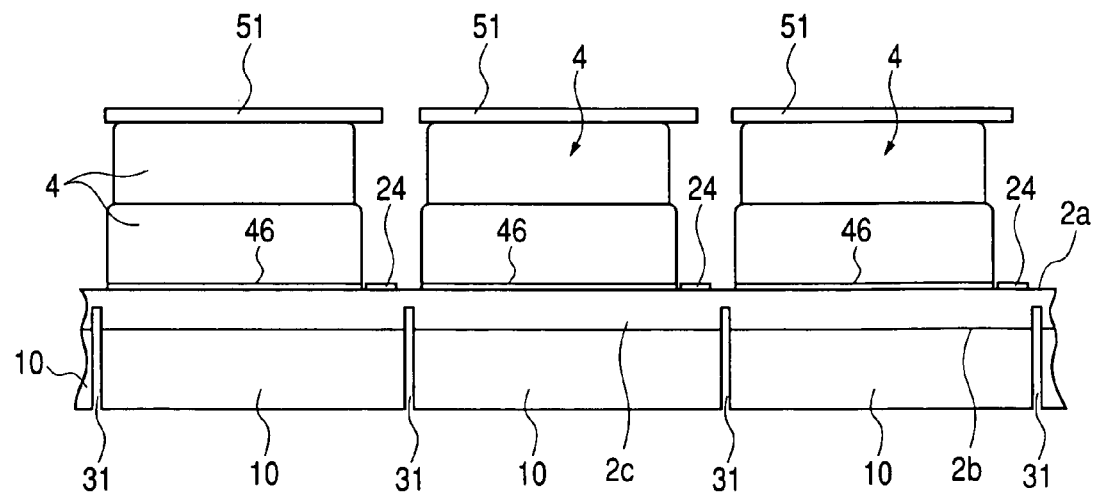
FIG. 28 is a side elevation view of the essential portion of the camera module under the manufacturing step following FIG. 27.
Figure 29:
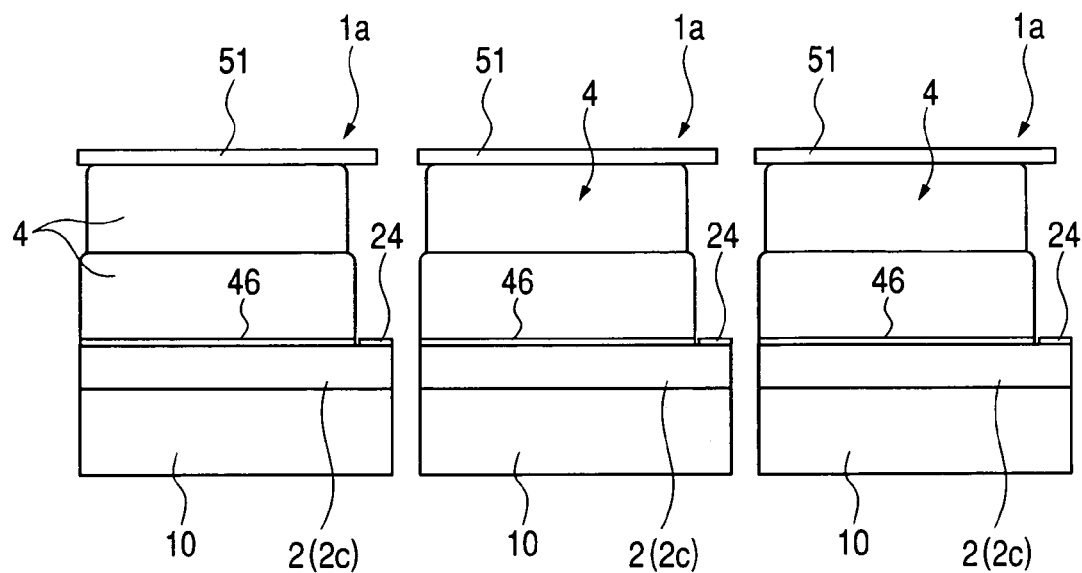
FIG. 29 is a side elevation view of the essential portion of the camera module under the manufacturing step following FIG. 28.

FIG. 28 and FIG. 29 are side elevation views of the essential portion of the camera module 1 under the manufacturing step following FIG. 27.

After the lens mount 4 is bonded to the wiring substrate 2c as described above, a protection film (tape) 51 is adhered to the upper part of the lens mount 4 as the mounting portion of the lens holder 5 in order to close the upper aperture of the lens mount 4 as illustrated in FIG. 28. The protection film 51 has the function to prevent entry of foreign matter into the lens mount 4 (particularly, to the surface of IR filter 16) from the upper aperture of the lens mount 4 in the subsequent steps.

Next, the wiring substrate 2c is cut into respective product regions 30 as illustrated in FIG. 29. In this case, unlike half-dicing (half-cut) of FIG. 7 and FIG. 8, the wiring substrate 2c is perfectly cut with full-dicing (full-cut). Thereby, a camera 1 module 1a as a individual piece (camera module under the manufacturing step) can be obtained. Moreover, the wiring substrate 2c is isolated into each product region 30 as the wiring substrate 2. The dicing line (cutting line) is located between the neighboring product regions 30 and this is almost identical to the position of the cutting groove 31 (dicing line) in the half-dicing (half-cut) step of FIG. 7 and FIG. 8. Moreover, the dicing is preferably executed from the side of surface 2a of the wiring substrate 2c. In addition, the conductor pattern 32 of the substrate 2c may be used for alignment of full dicing (eye mark).

In the cutting (full-dicing) step of the wiring substrate 2c, dry-dicing is adapted, in which dicing is performed without supply of water to a dicing blade during the dicing step. For example, a carbon blade (a blade consisting of carbon) may be used as the dicing blade. Influence of heat in the dry-dicing may be reduced by conducting the dry-dicing process using the carbon blade having excellent heat resistance. When the wet dicing is adapted, in which the dicing is conducted while water is supplied to the dicing blade, water easily enters the inside of lens mount 4 from an upper aperture of the lens mount 4 or the like and thereby a water mark will probably be generated at the surface of the IR filter 16. The water mark generated at the surface of IR filter 16 will cause a stain failure (ambiguous stain failure) in the image taken and displayed using the camera module 1. Therefore, entry of water into the lens mount 4 can be prevented and generation of stain failure resulting from the water mark of the IR filter 16 can also be prevented by cutting (full-cut) the wiring substrate 2c in the dry-dicing process. Therefore, reliability of camera module may be improved and manufacturing yield thereof can also be improved. In addition, entry of cutting chips into the lens mount 4 generated when the wiring substrate 2c is cut may be prevented by conducting the dry-dicing under the condition that the protection film 51 is attached on the upper part of the lens mount 4. The cutting chips adhered around the wiring substrate 2c, lens mount 4 and seal resin 10 may be removed with air-blowing.

Figure 30:
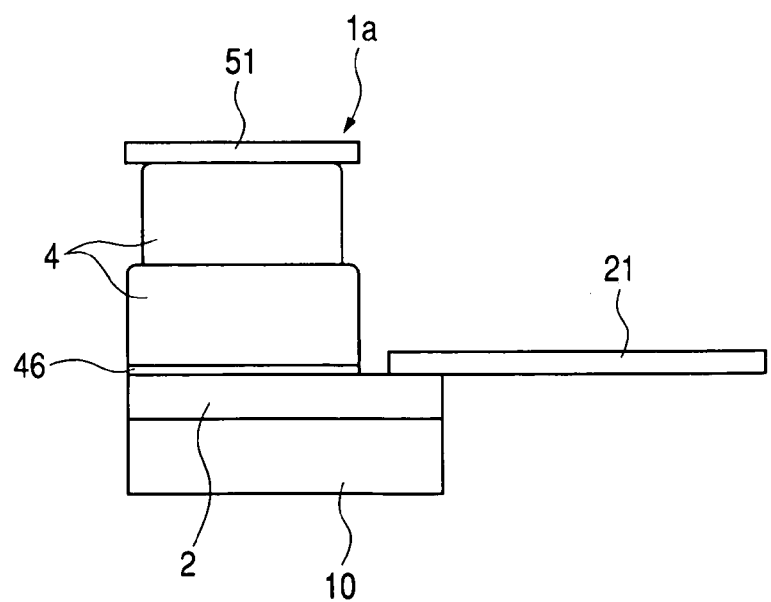
FIG. 30 is a side elevation view of the camera module under the manufacturing step following FIG. 29.

FIG. 30 is a side elevation view of the camera module under the manufacturing step following FIG. 29.

As illustrated in FIG. 30, the flexible substrate 21 is bonded (joined) to the wiring substrate 2 at the external side of the lens mount 4 in the camera module 1a. In this case, the flexible substrate 21 is bonded (joined) to the terminal portion 24 at the surface 2a of the wiring substrate 2 and the region near to this terminal portion.

Figure 31:
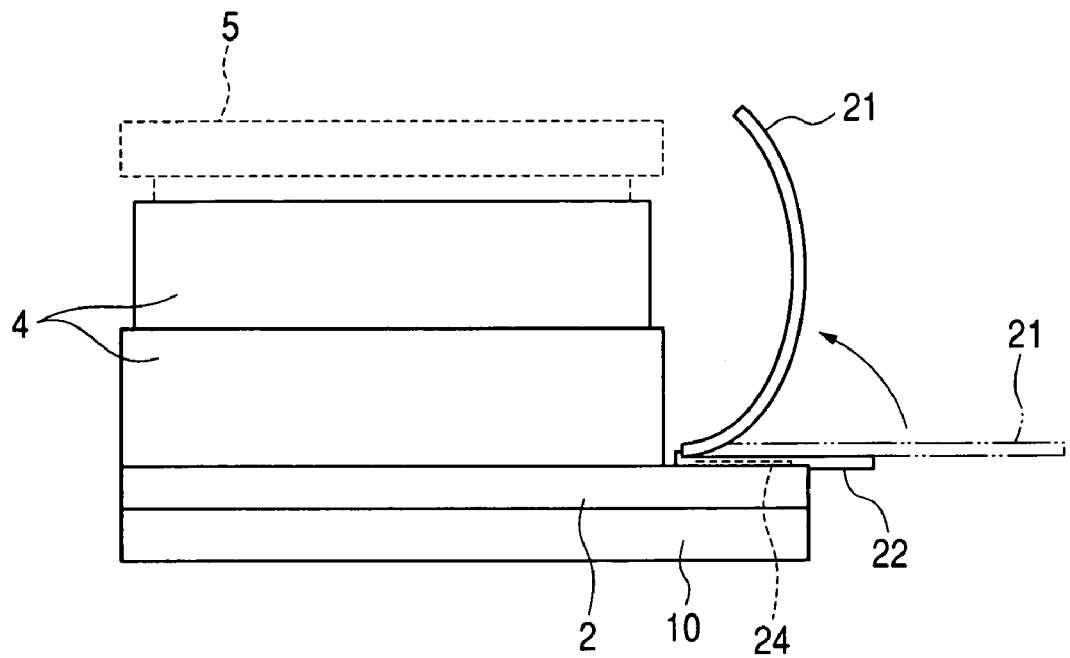
FIG. 31 is a diagram for describing the step to bond a flexible substrate to the wiring substrate.
Figure 32:
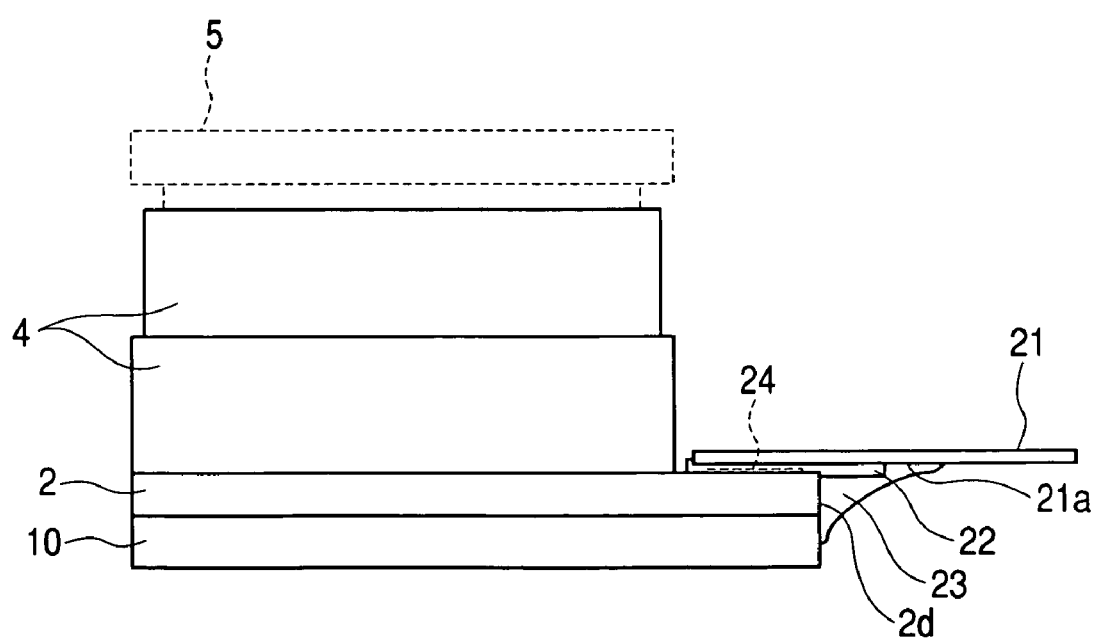
FIG. 32 is a diagram for describing the step to bond the flexible substrate to the wiring substrate.

FIG. 31 and FIG. 32 are diagrams (side elevation views) for describing the bonding step where the flexible substrate 21 is bonded to the wiring substrate 2.

First, the flexible substrate 21 is adhered to the surface 2a of the wiring substrate 2 via an anisotropic conductive film 22. In this case, the flexible substrate 21 is adhered to the surface 2a of the wiring substrate 2 via the anisotropic conductive film 22 and these are deposited or thermally deposited in the manner that after the one main surface of the anisotropic conductive film 22 is adhered to the flexible substrate 21, the other main surface of the anisotropic conductive film 22 is placed in contact on the region including the terminal portion 24 of the surface 2a of the wiring substrate 2. For example, the anisotropic conductive film 22 is hardened when it is heated while the flexible substrate 21 is pressed toward the wiring substrate 2. Thereby, the flexible substrate 21 is bonded (deposited) to the wiring substrate 2. The flexible substrate 21 is deposited to the wiring substrate 2 with the hardened anisotropic conductive film 22 and a wiring pattern (not illustrated) of the flexible substrate 21 is electrically connected to the terminal portion 24 at the surface 2a of the wiring substrate 2 via the conductive particles within the anisotropic conductive film 22.

When the flexible substrate 21 and the wiring substrate 2 are bonded only with the anisotropic conductive film 22, a tensile strength of the flexible substrate 21 is comparatively small. Therefore, when the flexible substrate 21 is bent, the flexible substrate 21 will probably be peeled from the wiring substrate 2 or anisotropic conductive film 22 as illustrated in FIG. 31. This event will lower the reliability of camera module and also lower the manufacturing yield thereof.

In the profile of the present invention, after the bonding between the flexible substrate 21 and wiring substrate 2 via the anisotropic conductive film 22, bonding between the wiring substrate 2 and flexible substrate 21 is reinforced with additional coating of the bonding material 23 as illustrated in FIG. 32. In this case, the bonding material 23 is coated or formed to extend exceeding the anisotropic conductive film 22 up to the main surface of the flexible substrate 21 from the side wall 2d (including the wide wall of the seal resin 10) of the wiring substrate 2. Namely, the bonding material 23 is coated or formed to extend to the part (here, side wall 2d of the wiring substrate 2) not in contact with the anisotropic conductive film 22 of the wiring substrate 2 from the part not in contact with the anisotropic conductive film 22 of the flexible substrate 21 (here, the part 21a not in contact with the anisotropic conductive film 22 among the main surface in the side opposing to the wiring substrate 2 of the flexible substrate 21). The bonding material 23 is hardened to deposit the wiring substrate 2 and flexible substrate 21 with the bonding material 23.

In the profile of the present invention, the flexible substrate 21 and the wiring substrate 2 are bonded via the anisotropic conductive film 22 and moreover these flexible substrate 21 and the wiring substrate 2 are also bonded with the bonding material 23. Namely, the flexible substrate 21 is bonded (joined) to the wiring substrate 2 with the anisotropic conductive film 22 and bonding material 23. Therefore, a tensile strength of the flexible substrate 21 can be relatively increased and peeling of the flexible substrate 2 when the flexible substrate 21 is bent may be suppressed or prevented. Accordingly, reliability of the camera module may be improved and manufacturing yield thereof may also be improved. In addition, when the camera module 1 is used for a mobile telephone, since the flexible substrate 21 is frequently and repeatedly bent, it is particularly effective to reinforce the bonding between the flexible substrate 21 and wiring substrate 21 with the bonding material 23 as in the case of the profile of the present invention.

Moreover, it is also possible that after the bonding between the flexible substrate 21 and wiring substrate 2 via the anisotropic conductive film 22, the lens holder 5 is mounted to the lens mount 4 and the flexible substrate 21 is then bonded to the wiring substrate 2 with the bonding material 23. In this case, it is more preferable that the bonding material 23 is formed with an ultraviolet-setting type bonding material. After the coating of the bonding material 23, the bonding material 23 can be hardened through irradiation of the ultraviolet ray. Therefore, the heating step to harden the bonding material 23 is no longer required and deformation of the lens 6 within the lens holder 5 due to the heat treatment can be prevented.

Figure 33:
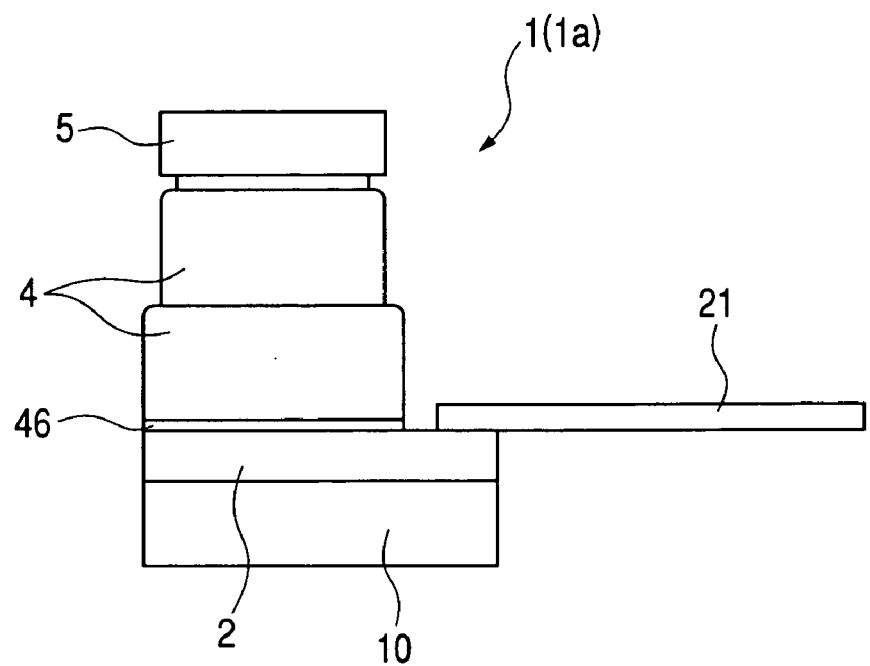
FIG. 33 is a side elevation view of the camera module under the manufacturing step following FIG. 30.

FIG. 33 is a side elevation view of the camera module 1 under the manufacturing step following FIG. 30.

As illustrated in FIG. 33, the lens holder 5 is mounted (loaded) to the lens mount 4 after the protection film 51 is peeled. As described in regard to FIG. 1, the lens 6 is held within the lens holder 5. Moreover, since the lower side surface (external wall) of the lens holder 5 and the internal wall at the upper part of the lens mount 4 are threaded, the lens holder 5 can be mounted to the lens mount 4 by inserting a part of the lens holder 5 into the upper aperture of the lens mount 4 while it is rotated. Thereafter, the height position of lens 6 for the sensor chip 3 is adjusted by the focusing process. This adjustment can be realized by rotating the lens holder 5. After the focusing process, the lens holder 5 and lens mount 4 are deposited with the joining material (not illustrated).

As described above, the camera module 1 as the profile of the present invention can be manufactured (completed).

In the profile of the present invention, after the rear surface 2b side of the wiring substrate 2 is assembled first, the surface 2a side of the wiring substrate 2 is assembled. Namely, after the system portion assembling steps of the rear surface 2b side of the wiring substrate 2 (mounting of the passive component 9, memory chip 8 and sensor chip 3 and wire bonding step as illustrated in FIG. 3 and the step to form the seal resin 10 as illustrated in FIG. 4 and the half-dicing step as illustrated in FIG. 7) are performed first, the optical system assembling steps in the surface 2a side of the wiring substrate 2 (mounting of sensor chip 3 and wire bonding step as illustrated in FIG. 9 and FIG. 10, bonding step of the lens mount 4 as illustrated in FIG. 20, adhering step of the protection film 51 as illustrated in FIG. 28, full-dicing step as illustrated in FIG. 29, bonding step of the flexible substrate 21 as illustrated in FIG. 30, and mounting step of lens holder as illustrated in FIG. 33) are conducted. If a foreign matter (dust or the like) is adhered to the components in the rear surface 2b side of the wiring substrate 2, for example, to the sensor chip 3, IR filter 16 and lens 6, a failure may occur in the image taken and displayed using the camera module 1 and thereby the manufacturing yield of the camera module 1 will probably be lowered. In the profile of the present invention, influence on the components in the surface 2a side of the wiring substrate 2 of a foreign matter caused in the system portion assembling steps of the rear surface 2b side of the wiring substrate can be prevented and adhesion of a foreign matter on the sensor chip 3, IR filter 16 and lens 6 can also be reduced by conducting first the system portion assembling steps of the rear surface 2b side of the wiring substrate 2 and then conducting the optical system assembling steps in the surface 2a side of the wiring substrate 2 which is very sensible for entry of a foreign matter. Accordingly, reliability of camera module 1 can be improved and the manufacturing yield thereof can also be improved.

Moreover, in the profile of the present invention, after the formation of the seal resin 10, the half-dicing is performed to form the cutting groove 31 to the seal resin 10. Thereby, warp of the wiring substrate 2c can be alleviated and may be flattened. As a result, bondability of the bonding wire 11 can be improved. In addition, when the lens mount 4 is bonded to the wiring substrate 2c, generation of a gap between the lens mount 4 and wiring substrate 2c can be prevented and entry of a foreign matter into the lens mount 4 can also be prevented. Accordingly, reliability of the camera module 1 can be improved and manufacturing yield thereof can also be improved.

In addition, in the profile of the present invention, dry-dicing is introduced for isolating the wiring substrate 2c into each product region 30 with full-dicing. Therefore, entry of water into the lens mount 4 can be prevented and generation of water mark in the IR filter 16 can also be prevented. Therefore, reliability of the camera module 1 can be improved and the manufacturing yield thereof can also be improved.

Moreover, in the profile of the present invention, the electrode pad 3a of the sensor chip 3 mounted on the surface 2a of the wiring substrate is electrically connected to the electrode 12 formed on the surface 2a of the wiring substrate 2 via the bonding wire 11. In addition, the stud bump 12a is formed on the electrode 12 of the surface 2a of the wiring substrate 2 and this stud bump 12a is connected with the bonding wire 11. Therefore, the connection strength between the bonding wire 11 and electrode 12 can be increased and peeling of the bonding wire 11 from the electrode 12 can be suppressed and prevented. Accordingly, reliability of the camera module 1 can be improved and manufacturing yield thereof can also be improved. In addition, since the connection strength between the bonding wire 11 and electrode 12 is increased, the distance up to the sensor chip 3 from the internal wall 4a of the leans mount 4 can be shortened and thereby the camera module 1 can be reduced in size.

Moreover, in the profile of the present invention, the flexible substrate 21 is bonded to the wiring substrate 2 via the anisotropic conductive film 22, and the flexible substrate 21 and the wiring substrate 2 are also bonded with the bonding material 23. Accordingly, a tensile strength of the flexible substrate 21 can be raised and peeling of the flexible substrate 21 when it is bent can be suppressed or prevented. Therefore, reliability of the camera module 1 can be improved and manufacturing yield thereof can also be improved.

In addition, in the profile of the present invention, when the lens mount 4 is coated with the bonding material 46, the bonding material layer is printed to the bonding surface 4b of the lens mount 4 with the squeeze 47 using the mask 42 including the mesh-pattern of printing region 42b. Since the bonding material layer may be formed uniformly on the bonding surface 4b of the lens mount 4, when the lens mount 4 is bonded to the wiring substrate 2c, generation of a gap between the lens mount 4 and the wiring substrate 2c can be prevented. Therefore, entry of a foreign matter into the lens mount 4 can be prevented and adhesion of foreign matter on the sensor chip 3, IR filter 16 or the like can also be suppressed or prevented. Accordingly, reliability of the camera module 1 can be improved and manufacturing yield thereof can also be improved.

Figure 34:
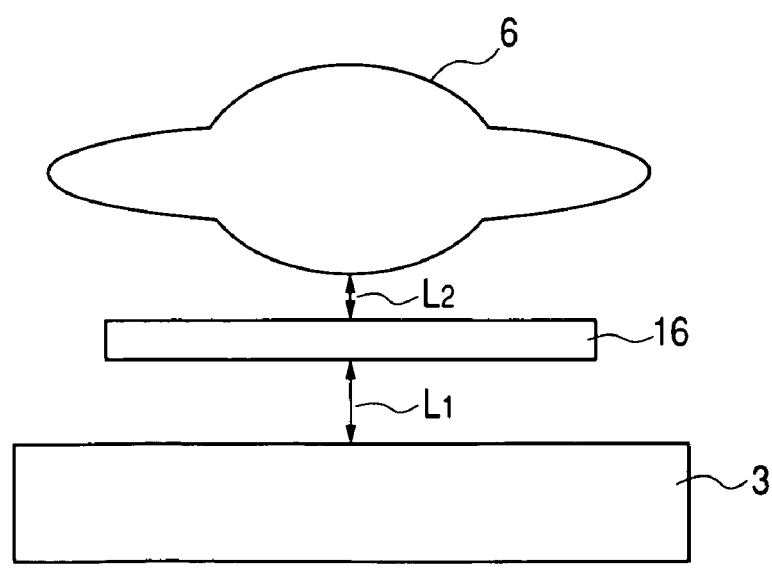
FIG. 34 is a diagram for describing the camera module of another embodiment of the present invention.

Moreover, when a foreign matter enters the lens mount 4 and is adhered on the surface of IR filter 16, a failure is caused in the image taken and displayed using the camera module 1. In order to reduce influence on the image of a foreign matter adhered to the surface of the IR filter 16, the distance (interval) between the IR filter 16 and the sensor can be set larger than that between the IR filter 16 and lens 6. FIG. 34 is the diagram for describing the camera module of the other profile of the present invention. This camera module is identical to the camera module 1 of FIG. 1 except for the positional relationship among the IR filter 16, sensor chip 3 and lens 6. In order to simplify the figure, the part other than the IR filter 16, sensor chip 3 and lens 6 is eliminated here.

In FIG. 34, the IR filter 16 is allocated nearer to the lens 6 more than the sensor chip 3. Influence of a foreign matter (for example, cutting chips generated by the dry-dicing of the wiring substrate 2c) even if such a foreign matter is adhered on the surface of the IR filter 16, on the image taken and displayed using the camera module 1 can be reduced by setting the distance (interval) $L_1$ between the IR filter 16 and the sensor chip 3 larger than the distance (interval) $L_2$ between the IR filter 16 and lens 6 ($L_1 > L_2$) Accordingly, manufacturing yield of semiconductor device can be improved.

The present invention has been described based on the preferred embodiments thereof but the present invention is never limited thereto and allows various changes and modifications within the scope not departing from the claims thereof.

In above description, the present invention has bee applied to the camera module using a CMOS image sensor as the typical application field thereof. But the present invention is never limited only to such application and can also be widely applied to the other camera modules using, for example, a CCD (Charge Coupled Device) image sensor.

What is claimed is:

1. A method of manufacturing solid-stage image sensing device comprising the steps of:
   (a) mounting electronic components on a first main surface of a wiring substrate;
   (b) forming a sealing portion to seal said electronic components on said first main surface of said wiring substrate;
   (c) mounting, after the step (b), image sensing elements on a second main surface in an opposite side of said first main surface of said wiring substrate;
   (d) joining, after the step (b), a frame body on said second main surface of said wiring substrate covering said image sensing elements;
   (e) adhering a protection film to said frame body after said step (d) but before said step (f);
   (f) cuffing, after the step (d), said wiring substrate; and
   (g) mounting, after the step (e), a lens holding portion comprising a lens within said frame body.

2. The method of manufacturing solid-state image sensing device according to claim 1, further comprising the step of:
   removing said protection film from said frame body after said step (f) but before said step (g).

3. The method of manufacturing solid-state image sensing device according to claim 1, further comprising the step of:
   cutting, after the step (f), said wiring substrate; and removing said protection film from said frame body after the cutting step.

4. A method of manufacturing solid-state image sensing device comprising the steps of:
   (a) mounting electronic components on a first main surface of a wiring substrate;
   (b) forming a seal resin portion to seal said electronic components on said first main surface of said wiring substrate;
   (c) forming a groove to said seal resin portion after said step (b);
   (d) mounting, after said step (c), image sensing elements on a second main surface in an opposite side of said first main surface of said wiring substrate;
   (e) joining, after the step (d), a frame body on said second main surface of said wiring substrate covering said image sensing elements; and
   (f) adhering a protection film to said frame body after said step (e).

5. The method of manufacturing solid-state image sensing device according to claim 4, wherein said groove is formed in said step (c) with half-dicing from said first main surface side of said wiring substrate.

6. The method of manufacturing semiconductor image sensing device according to claim 4, wherein said wiring substrate includes a plurality of product regions, said seal resin portion is formed in said step (b) to simultaneously seal said electronic components in said plurality of product regions, and said groove is formed in said step (c) between said plurality of product regions.

* * * * *